United States Patent [19]

Fernandes

[11] Patent Number: 4,709,339

[45] Date of Patent: Nov. 24, 1987

[54] ELECTRICAL POWER LINE PARAMETER MEASUREMENT APPARATUS AND SYSTEMS, INCLUDING COMPACT, LINE-MOUNTED MODULES

[76] Inventor: Roosevelt A. Fernandes, 104 Ruby Rd., Liverpool, N.Y. 13088

[21] Appl. No.: 859,497

[22] Filed: May 5, 1986

Related U.S. Application Data

[63] Continuation-in-part of Ser. No. 484,681, Apr. 13, 1983, Pat. No. 4,689,752.

[51] Int. Cl.$^4$ .................... G01R 19/00; G08B 21/00
[52] U.S. Cl. .................................. 364/492; 324/127; 340/657; 340/870.17; 364/483
[58] Field of Search ................... 364/464, 492, 483; 324/17, 127, 133; 340/538, 539, 657, 870.17, 870.38

[56] References Cited

U.S. PATENT DOCUMENTS

| | | | |
|---|---|---|---|
| 3,453,544 | 7/1969 | Schweitzer, Jr. | 324/127 |
| 4,158,810 | 6/1979 | Leskovar | 340/870.17 |
| 4,384,289 | 5/1983 | Stillwell et al. | 340/870.17 |
| 4,415,896 | 11/1983 | Allgood | 324/127 |
| 4,420,752 | 12/1983 | Davis et al. | 340/870.17 |

*Primary Examiner*—Felix D. Gruber
*Assistant Examiner*—Kevin J. Teska
*Attorney, Agent, or Firm*—Charles S. McGuire

[57] ABSTRACT

The invention is primarily directed to sensor modules for mounting directly upon energized electrical power lines to monitor parameters associated with operation thereof, wherein the modules have a more compact lateral configuration than prior art modules designed for the same purpose. The modules include a first, cylindrical housing portion containing the sensing means and other electronic data processing and transmitting elements, and a second housing portion, affixed to the exterior of the first portion and extending not more than about 150° around the periphery thereof, and enclosing mechanical elements of the module mounting means. The invention also concerns means for improving the accuracy of voltage measurements made by such modules by compensating for effects of adjacent, energized conductors, means for reducing the number of frequency channels required for RF data transmissions by a large number of sensor modules at a substation, means for acquiring time-synchronized data from multiple modules within a substation for accurate post-fault, sequence-of-events analysis, means for performing high speed sampling and comparison of cyclically variable parameters for relaying and harmonic measurement applications, and optical communications links for transmitting data from sensor modules.

29 Claims, 25 Drawing Figures

| $S_i$ | $V_f$ | $V_f-1$ | $V_f/V_f-1$ |
|---|---|---|---|
| 1 | | | |
| 2 | | | |
| ○ | | | |
| ○ | | | |
| ○ | | | |
| ○ | | | |
| ○ | | | |
| 24 | | | |

| $S_i$ | $i_f$ | $i_f-1$ | $i_f/i_f-1$ |
|---|---|---|---|
| 1 | | | |
| 2 | | | |
| ○ | | | |
| ○ | | | |
| ○ | | | |
| ○ | | | |
| ○ | | | |
| 24 | | | |

TABLE 1
COMPARISON OF SUCCESSIVE
VOLTAGE & CURRENT SAMPLES

| WORD | | | | | |
|---|---|---|---|---|---|
| 0 | GP | PH | | | |
| 1 | NO ADJ CKT ENERGIZED | BOTH ADJ CKTs ENERGIZED | PHASE 1 ADJ. CKT ENERGIZED | PHASE 3 ADJ. CKTs ENERGIZED | VOLTAGE SCALE FACTORS |
| 3 | CURRENT SCALE FACTOR ||||||
| 5 | TEMPERATURE SCALE FACTORS (IF PROBE IS ADDED) ||||||
| 7 | TEMPERATURE OFFSET (IF PROBE ADDED) ||||||

*FIG. 12*

| WORD | | | | | | |
|---|---|---|---|---|---|---|
| 0 | DI | AC | VP | IT | SENOR MODULE ID | BUFFER AGE |
| 1 | $V_a$ ||||||
| 3 | $V_b$ ||||||
| 5 | $I_a$ ||||||
| 7 | $I_b$ ||||||
| 9 | TEMP (IF PROBE ADDED) ||||||
| 10 | $V_{EFF}$ ||||||
| 12 | $I_{EFF}$ ||||||
| 14 | SCALED TEMP (IF PROBE ADDED) ||||||
| 16 | TOTAL WATTS ||||||
| 17 | WATT SECONDS ||||||
| 18 | KILOWATT HOURS ||||||

*FIG. 11*

ELECTRICAL POWER LINE PARAMETER MEASUREMENT APPARATUS AND SYSTEMS, INCLUDING COMPACT, LINE-MOUNTED MODULES

CROSS-REFERENCE TO RELATED APPLICATION

This application is a continuation-in-part of copending application Ser. No. 484,681, filed Apr. 13, 1983, now U.S. Pat. No. 4,689,752.

BACKGROUND OF THE INVENTION

This invention relates to systems for measuring and communicating various operating parameters associated with electrical power conductors; more specifically, the invention relates to systems which include line-mounted sensor modules having means for both transmitting signals commensurate with parameter values and optionally for receiving signals to permit time-synchronized data sampling and transmission in a manner allowing highly accurate measurement and analysis of data from a large number of modules at a single ground station.

Various power line mounted apparatus for sensing operating parameters of an associated conductor have been disclosed in the prior art. See, for example, U.S. Pat. Nos. 3,428,896, 3,633,191, 4,158,810 and 4,261,818, as well as the improved systems disclosed in the copending applications referenced herein. In general, such systems include line-mounted sensor modules which measure certain quantities associated with operation of overhead power lines, namely, current, conductor temperature and ambient temperature, and transmit such data via a radio link to a nearby ground station. Data from several ground stations is then transmitted to a central control station where it is processed and used to assist in control of the power supplied to the various transmission lines in accordance with the measured parameters.

Prior art systems of this type, while representing a significant improvement over traditional means of measurement and control of power line operating parameters, still have a number of inherent limitations and disadvantages, some of which are addressed in copending application Ser. No. 859,496, of the present inventor, filed concurrently herewith. Said application, for example, provides means for simultaneously measuring current, voltage and phase angle on multiple conductors of a single circuit or of many circuits thereby permitting monitoring of an entire substation. It is possible, however, that the accuracy of measurement of quantities such as voltage on a particular circuit may be adversely affected by adjacent, energized circuits. Also, time synchronized data collection for sequence-of-events application is not possible. Other drawbacks of the previously disclosed systems are high speed sampling for relaying and harmonic measurements is not possible for an entire substation installation; and, the use of certain sensor modules on distribution circuits with relatively small conductor clearances, as compared to extra high voltage transmission circuits, is difficult if not prohibitive.

The objects of the present invention are addressed to providing improvements in power line parameter monitoring and analysis systems which deal with each of the aforementioned disadvantages of prior art systems. Among the specific objects of the invention, all within the context of systems for collecting and transmitting parameters associated with electrical power line operation which employ line-mounted sensor modules, are: to improve the accuracy of voltage measurement in the presence of adjacent conductors, irrespective of whether the latter are energized; to reduce the number of frequency channels required for use by a large number of sensor modules at a substation, thus reducing licensing constraints; to provide hot-stick mountable, integrated sensor modules which can be installed on power lines with relatively close spacing between adjacent conductors; to permit time-synchronized data acquisition from multiple modules within a substation for accurate post-fault, sequence-of-events analysis; to provide means for high speed sampling and comparison of cyclically variable parameters for relaying and harmonic measurement applications; and, to provide communications links other than RF broadcast signals for transmitting data from sensor modules.

SUMMARY OF THE INVENTION

In accordance with the foregoing objects, the invention contemplates a hot-stick mountable sensor module having, in a principal aspect of the invention, a configuration uniquely suitable for employment on power lines where spacing presents a constraint. That is, modules of the prior art are typically toroidal in shape and have a diameter on the order of 12", which is suitable for mounting on extra high voltage power transmission lines, but not on the more closely spaced, lower voltage (e.g., below 34.5 KV) power distribution lines. In an embodiment particularly adapted for use where lateral clearances are constrained, the present invention comprises a compact, generally cylindrical, metallic housing for the electrical components of the module, including the parameter sensing, transmitting and receiving equipment, with the mechanical members of the mounting means positioned outside the cylindrical housing. The mounting members are enclosed in an arcuate, insulated housing portion affixed to the exterior of the cylindrical housing and extending not more than about 150° around the periphery thereof in order to avoid clearance problems due to spacing of the conductors.

The modules include means for sampling the values of voltage and current on the associated conductor at a rapid rate, i.e., at relatively short, evenly spaced time intervals, e.g., 24 times in each cycle of voltage and current. This high speed sampling permits use of the monitoring system for relaying and harmonic measurements for an entire substation, post-fault, sequence-of-events analysis, and storage of transient waveforms.

BRIEF DESCRIPTION OF THE DRAWINGS

FIG. 10 illustrates the relationship of the sheets bearing FIGS. 10A and 10B to form a single block diagram;

FIG. 11 displays the transceiver sensor module message format;

FIG. 12 displays the Scale Factors used;

FIG. 15 comprising

DETAILED DESCRIPTION

Figure 1A:
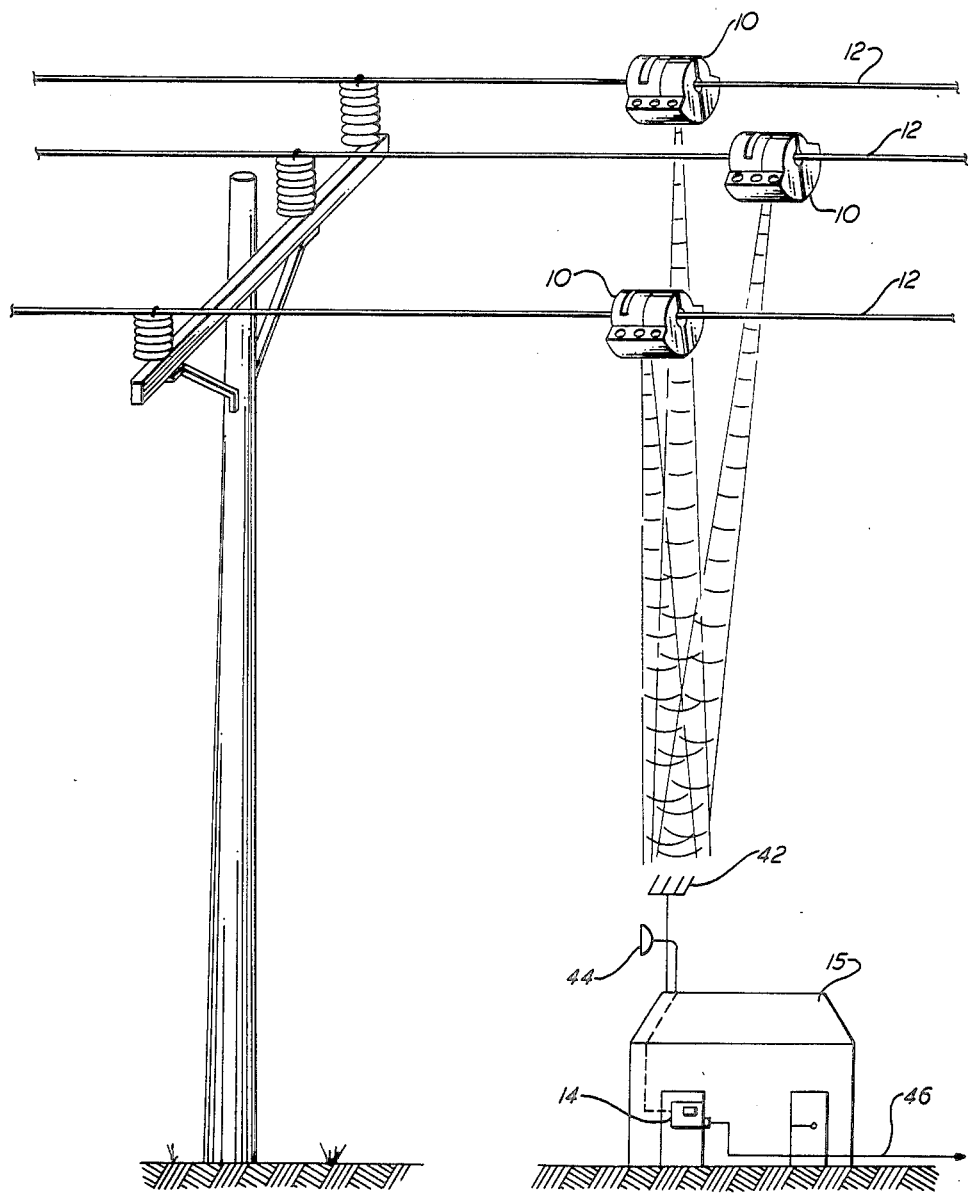
FIG. 1A is a perspective view of several sensor modules of the invention attached to the three phase conductors of an electric power line showing a first means of data communication with a ground station.
Figure 4:
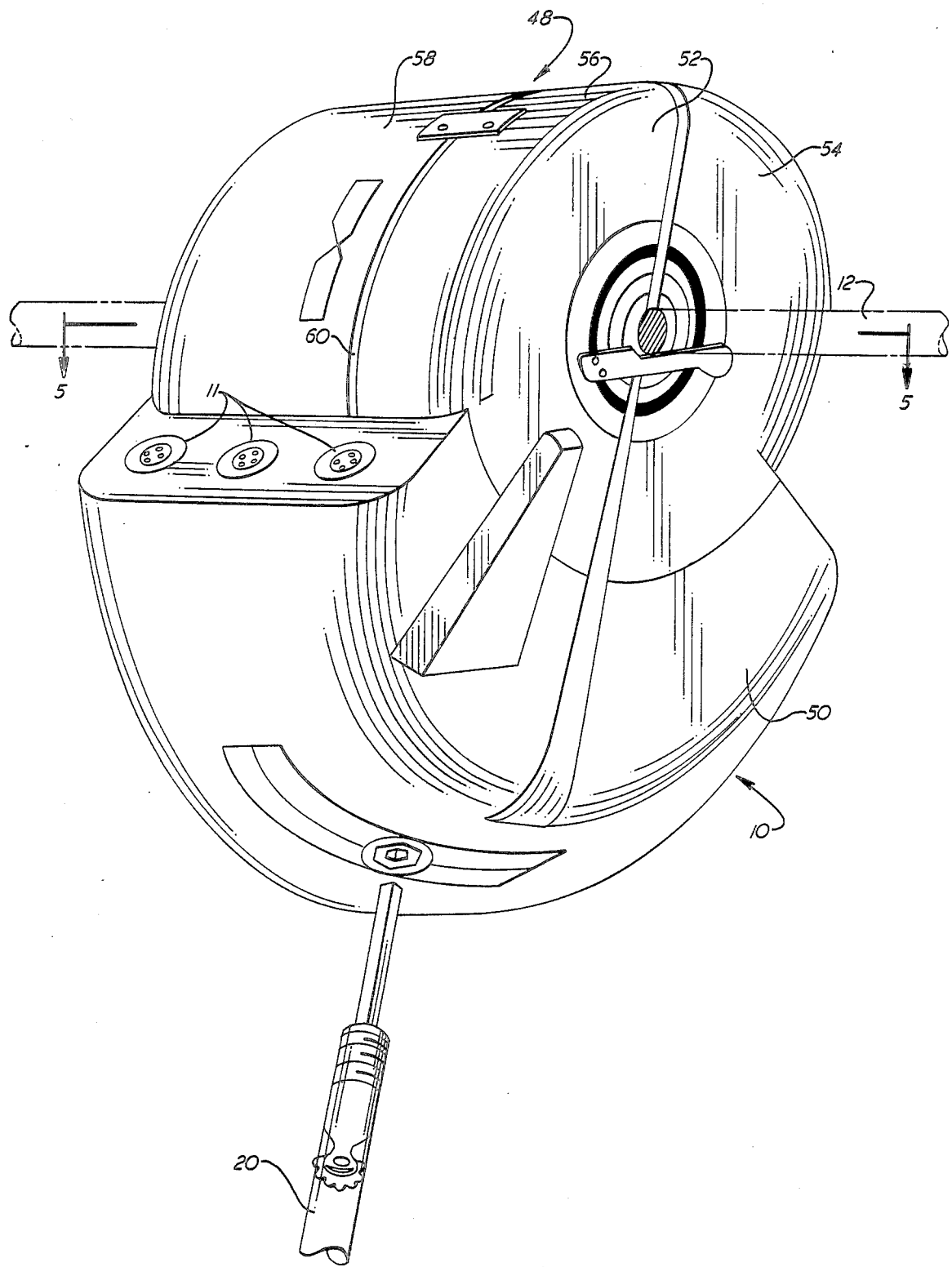
FIG. 4 is an enlarged, perspective view of a preferred embodiment of the sensor modules of FIGS. 1–3.

Sensor modules 10, shown in FIG. 1A and in more detail in FIG. 4, are of a type suitable for mounting upon energized power lines for sensing various parameters associated with operation of the power line and/or environmental parameters, and have a physical configuration particularly well suited for use on power conductors which are spaced more closely to one another than typical EHV power lines. Modules 10 include housing means which enclose the necessary elements for sensing the values of the parameters to be measured, and transmitting signals commensurate with the sensed values to signal receiving and processing means, collectively referred to as Combined Remote Terminal Unit (CRTU) 14, in control house 15 at ground level. Each module normally obtains its operating power from the magnetic field generated by current flowing in the associated conductor, and preferably include power backup means such as rechargeable batteries which provide the necessary operating power when line current is not present, or is below a predetermined value, as described more fully in the previously referenced application filed of even date herewith.

Figure 1B:
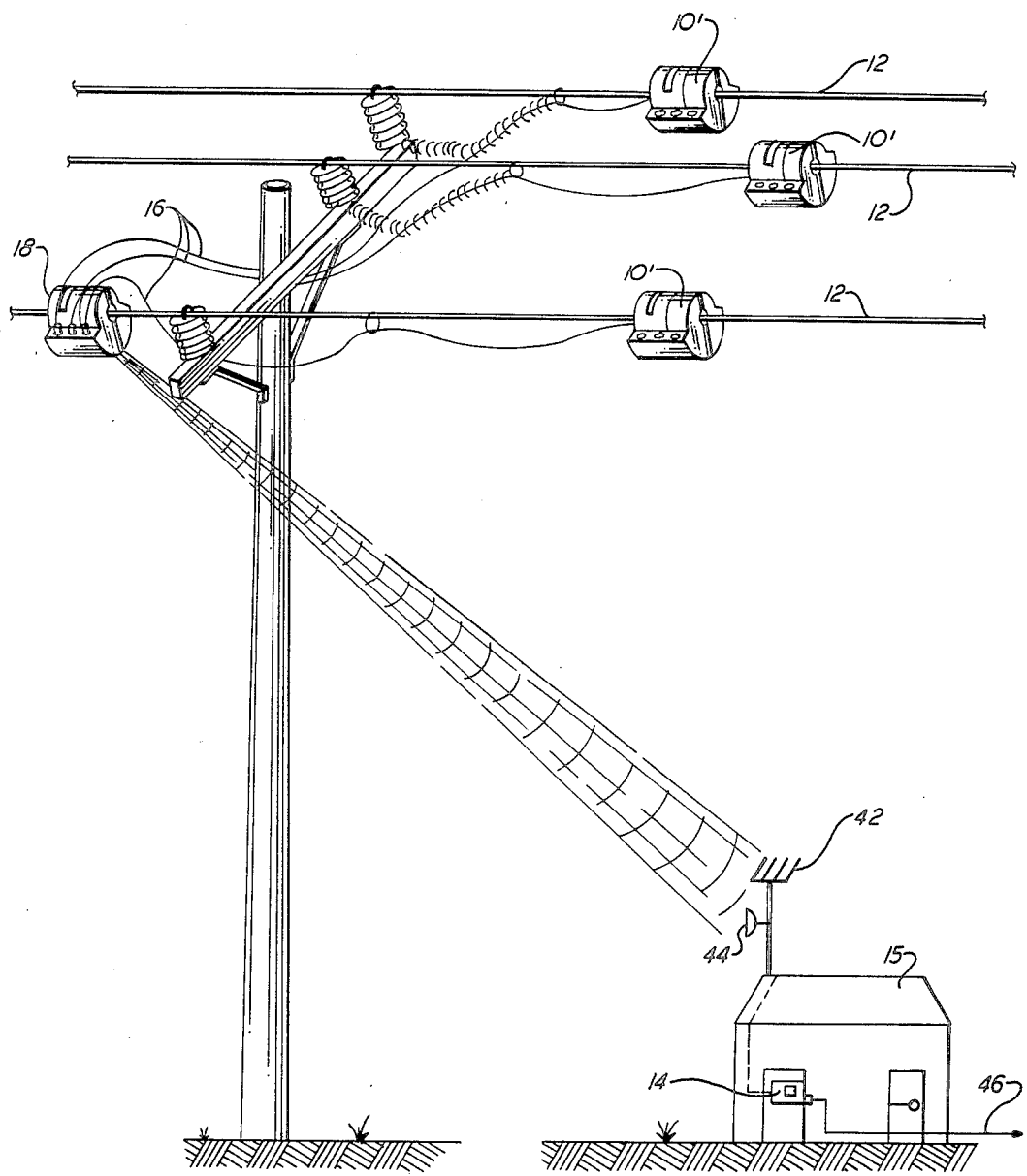
FIG. 1B is a perspective view, as in FIG. 1A, showing a second means for communication between the sensor modules and ground station.
Figure 2:
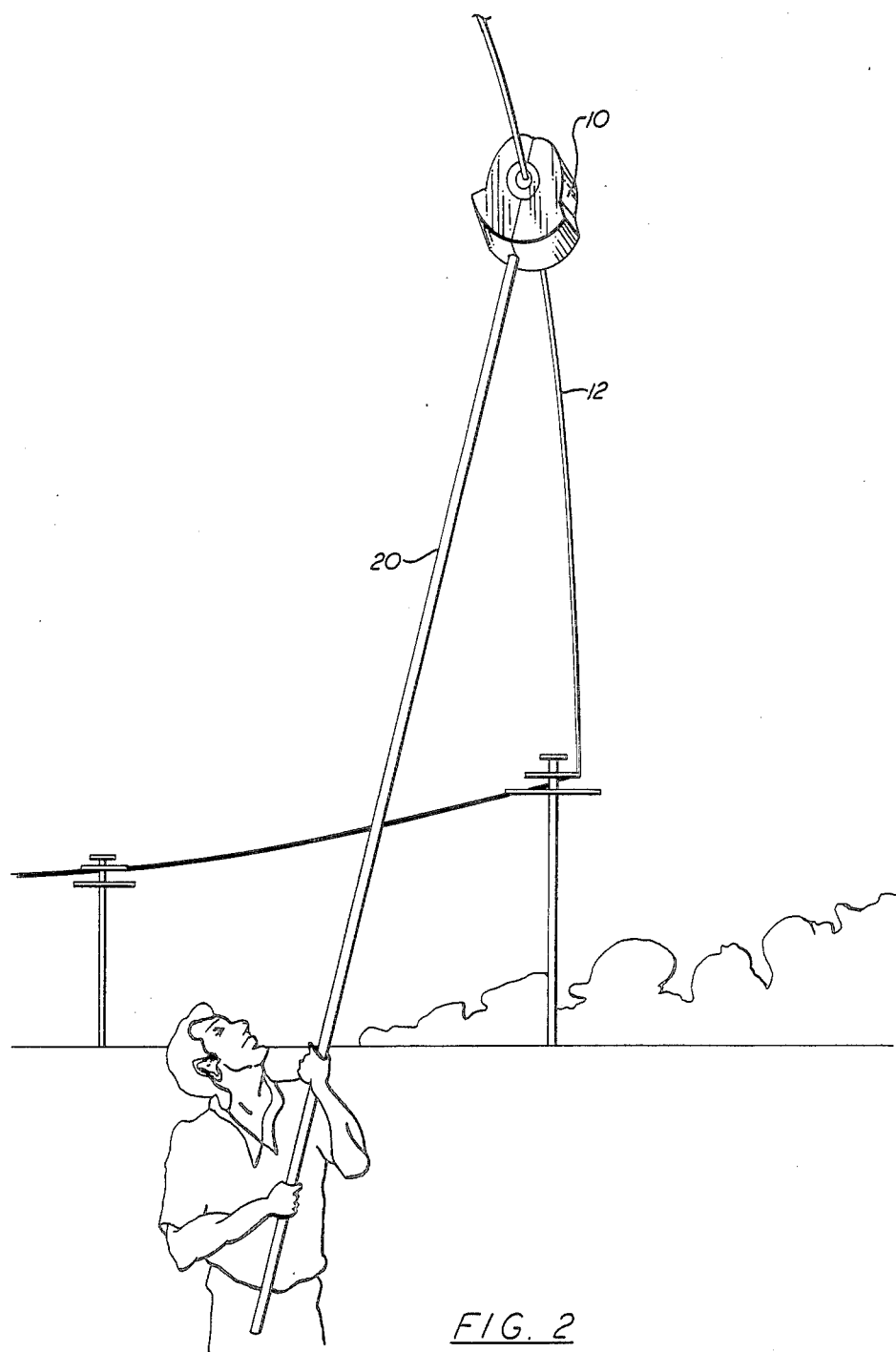
FIG. 2 is a perspective view of a sensor module embodying the present invention being mounted on a high voltage line.

Modules 10 of FIG. 1A each contain an RF transmitter and antenna for transmitting data to the ground station, whereas modules 10' of FIG. 1B are each connected by optical fibers 16 terminating in male fiber optic termination ferrules to data concentrator module 18 (with fiber optic ferrule connecting socket) which then transmits a sequence of coded signals indicating the values of the various parameters sensed by all three modules 10' to CRTU 14 via an RF radio link. In some instances, it may be desireable to eliminate RF links altogether and provide instead optical fibers extending directly from the individual modules 10', or concentrator module 18, to the CRTU. FIG. 2 illustrates the manner in which modules 10, 10' and 18, the external configurations and mounting mechanisms of which are essentially identical, are mounted on an energized conductor 12 by an individual manipulating conventional hot-stick 20. Any special tool which may be required for cooperative engagement with the particular mounting mechanism used in the modules is attached to the end of hot-stick 20, as described later. The sensor modules may also be installed using insulated rubber gloves on energized distribution voltage power conductors.

Before proceeding with further details of construction and operation of the individual sensor modules, a typical power monitoring system employing such modules will be described with reference to FIG. 3 wherein is shown a diagrammatic representation of an electrical power substation enclosed by station fence 22. A plurality of three phase circuits, numbered 1–8, are fed from a common bus comprising three phases 24, 26 and 28, each connected through circuit breaker 30 to transformer bank 32. The latter is fed by an incoming three-phase power circuit comprising three conductors denoted collectively by reference numeral 34. Sensor modules 10 are mounted upon each of the three phases of line 34, and of line 36, connecting transformer bank 32 to breakers 30. Conductors carrying each phase of all circuits emanating from the substation are equipped with a line-mounted sensor module 10. Conventional circuit breakers 38 are interposed in each conductor between its respective connection to the common bus phase and the associated sensor module 10.

Each of modules 10 is equipped to measure the values of voltage and current, and to determine the phase relationships thereof, of its associated conductor and may, if desired, be further equipped to measure other parameters such as frequency, conductor temperature, ambient temperature, vibration, etc. The sensed values are digitized, encoded and transmitted using an RF signal to the ground station. Transmissions from each module are controlled to occur in bursts of predetermined duration in such a way that no two modules are transmitting at the same time on the same frequency.

The previously referenced, concurrently filed application describes two means of controlling the time and intervals at which transmissions begin by each of the modules in the system. The first means is self-contained within the modules and involves using a zero crossing of the voltage on one phase of a bus line as a reference signal for timing transmissions by all modules mounted on conductors connected to the common bus. The second means involves providing each module with a receiver, as well as a transmitter, for receiving messages from a transmitter at the ground station; the messages include an address unique to each module and an assigned time slot for transmission of data by the module transmitter. For example, CRTU 14 may communicate with all modules in the system through transmit and receive antennae 42 and 44, respectively.

Corresponding communication equipment of the sensors is shown and described later. All sensors transmit data on a single frequency channel for reception by antenna 44; signals are transmitted by the ground station from antenna 42 on a second frequency channel for reception by the sensor receivers. For example, the system may employ a 950 MHz FM "uplink" (from the ground station to the sensor modules) and a 928 MHz FM "downlink". This Time Division Multiple Access (TDMA) technique is useful for controlling the timing of parameter sensing as well as data transmissions by the various modules and is necessary in order to carry out a number of desireable features of the present invention.

Sensor module electronics include a microprocessor, RAM, I/O, and timer components, as disclosed in parent application Ser. No. 484,681. The sampled values of the monitored parameters are digitized, stored in RAM, and communicated to the ground station during the established time interval as a burst of signals. The ground station includes a microprocessor to which signals received from modules 10 are supplied for further processing, such as calculation of total circuit and/or substation kilowatts, kilowatt hours, kilovars, etc. The data is then communicated to a central data receiving and control facility by a data link schematically indicated at 46, such as radio, land lines or satellite channels. Thus, all parameters necessary for monitoring and control of an entire substation, including relaying and post-fault analysis functions, may be measured, processed and communicated through the present invention, details of construction and operation of which appear in the balance of the disclosure.

Figure 5:
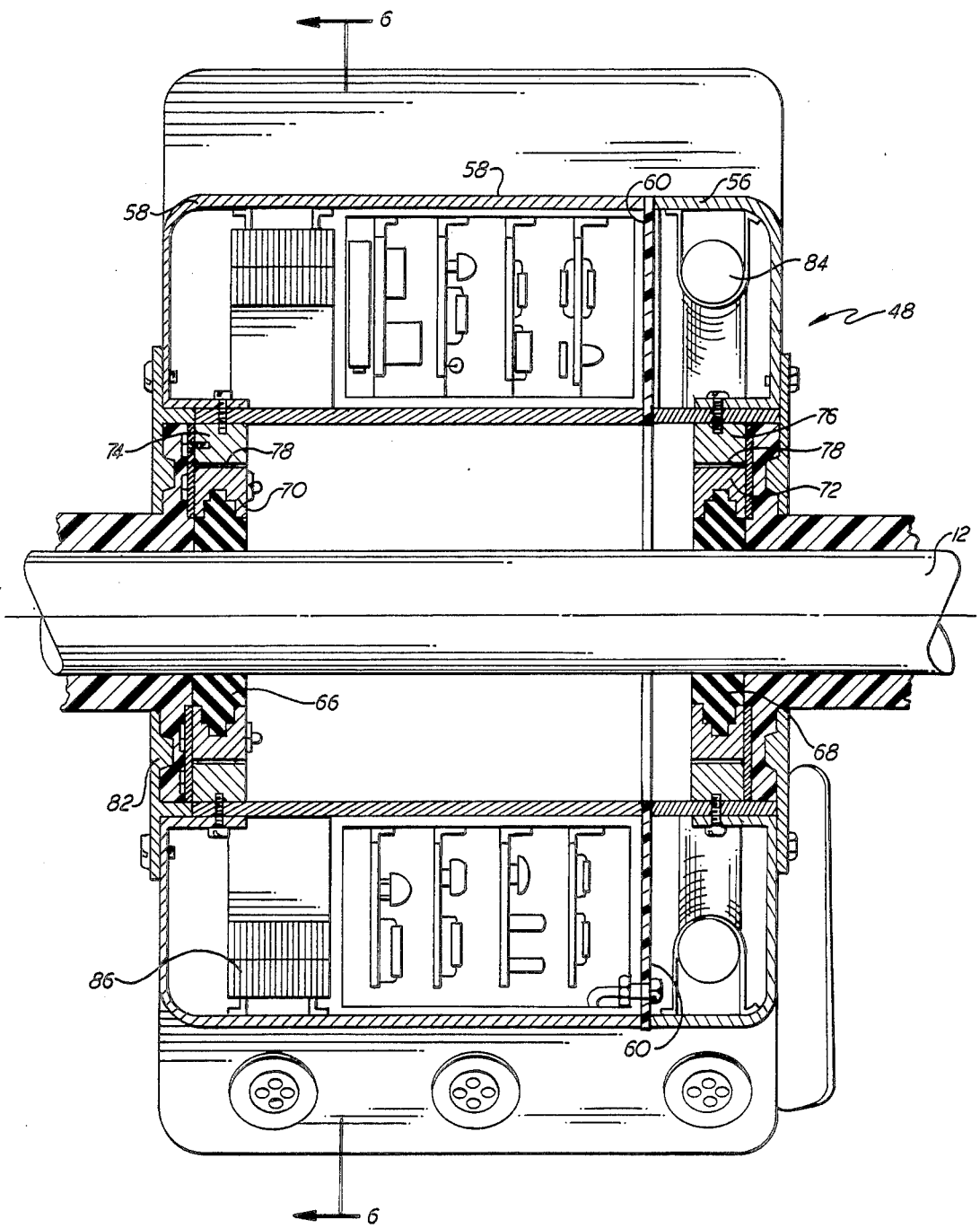
FIG. 5 is a cross-sectional view of the sensor module on the line 5—5 of FIG. 4.

Constructional details of module 10 are shown in more detail in FIGS. 4 and 5. The outer physical configuration of module 10 is basically defined by two housing portions, a first, essentially cylindrical portion 48, and a second portion 50 in the form of a circumferentially truncated cylinder, affixed to and extending less than half the distance, preferably not more than about 150°, around first portion 48. At least the outer skin of first housing portion 48 is metallic; for example, the entire cylinder may be a metal casting, or the substructure may be Fiberglas or other dielectric material with an outer coating of electrically conducting metal. Second portion 50 is made of heavy duty plastic or other such non-conducting material. Fiber optic receptacles 11 for fiber optic male terminal ferrules for interconnection with the data concentration module 18, FIG. 1B are also shown in FIG. 4.

When module 10 is mounted on conductor 12, as seen in FIGS. 4 and 5, the latter extends along the central axis of the cylinder formed by first housing portion 48. In order to mount the module upon the conductor in this manner, the module is divided into right and left halves, as indicated by the left and right halves of the end of the cylinder seen in FIG. 4 and denoted by reference numerals 52 and 54, respectively. The division also extends through second housing portion 50 and the left and right halves are coupled for relative movement by a hinge/pivot mechanism housed principally within portion 50, as discussed later in more detail.

First housing portion 48 is further divided into front and rear sections 56 and 58, respectively, by a plane transverse to the axis of the cylinder. Sections 56 and 58 are separated by gasket 60 of a suitable material which maintains sections 56 and 58 electrically insulated from one another. The sections may be bolted together, but the bolts (not shown) extend through plastic inserts to avoid completing an electrical path between the two sections. This prevents an electrical short circuit, i.e., a complete conducting path, from extending around the metal housing portion in a direction parallel to the surrounded conductor which would interfere with operation of electrical components which are mounted within housing portion 48 in a manner described later. All surfaces of housing portion 48, including where the cylindrical wall meets the ends, are rounded and free of sharp edges to avoid corona conditions which could occur when the modules are mounted on lines carrying higher voltage levels.

Modules 10 are constructed as double-walled cylinders, the inner wall being shown in FIG. 5 and divided in the same manner as the outer wall into front and rear sections 56 and 58, respectively. The inner wall is also divided, of course, into right and left halves, as previously described in connection with the other elements, for opening and closing movement about conductor 12. A hub structure for engagement of module 10 with conductor 12 is provided within both the front and rear ends of the module. Electrically conductive, annular inserts 66 and 68 preferably of a somewhat resilient material such as Neoprene, having a central opening of the same or slightly smaller diameter as conductor 12 are positioned within annular rings 70 and 72, respectively, also of electrically conductive material, at opposite ends of module 10. Rings 70 and 72 are surrounded by conductive rings 74 and 76, respectively, which are in electrical contact with housing 48. A layer of insulating material 78 separates rings 70 and 72 from rings 74 and 76, respectively, to provide a portion of the means for sensing the voltage on conductor 12, as explained more fully in the previously referenced, concurrently filed application. Optional heavy duty plastic hub caps 80 and 82 are affixed to the front and rear ends, respectively, of module 10 to provide a protective, moisture-proof seal for the hub portions.

Figure 6:
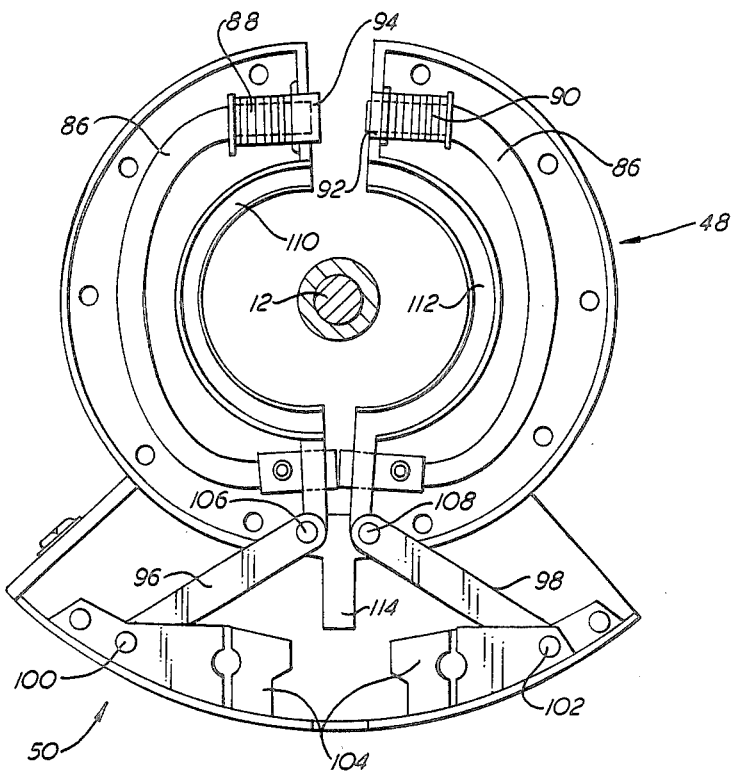
FIG. 6 is an end elevational view on the line 6—6 of FIG. 5.

As seen in FIG. 5, Rogowski coil 84 is mounted in the front section of module 10 to extend around conductor 12 and provide a means for sensing the current flowing through the conductor when module 10 is mounted thereon. Iron core 86 is mounted in the rear section of module 10, surrounding conductor 12 to provide means for obtaining the power necessary for operation of the electronics of the module from conductor 12 when sufficient current is flowing therethrough. Conductor 12 serves as a single-turn primary and power pick-off coils 88 and 90 (FIG. 6) on core 86 as the secondary windings of a power transformer. Core 86 is divided into right and left halves for movement with the other portions of the right and left halves of module 10 as the latter is opened and closed for mounting upon conductor 12. The pole faces at the upper end of core 86 are respectively surrounded by a moisture-proof recess 92 and a mating, plastic shroud 94, as also disclosed and claimed in the companion application filed of even date herewith.

As previously mentioned, module 10 is divided into two relatively moveable sections for mounting upon an existing power conductor in surrounding relationship thereto. There are, of course, many mechanical systems suited to accomplish such mounting of the module and the present invention is not concerned with details of design of the mounting means. One such means which may be employed, with suitable modifications to take into account the particular configuration of module 10, is the hinge/pivot mechanism disclosed in parent application Ser. No. 484,681. In that application, the hinge/pivot mechanism is disclosed in connection with a toroidal module and the mechanical elements are housed within the toroid. Since the present application is concerned in one aspect with providing a module of more compact dimensions, at least in that portion containing the electronic elements and conductive housing surface, most of the mechanical members of the structure providing relative movement of the two sections are contained in second insulated housing portion 50. This permits cylindrical housing portion 48 to have a diameter on the order of one-half that of the toroidal modules of the previously referenced application.

The structure providing relative movement of the left and right housing sections includes a pair of arms 96 and 98, each pivotally connected at one end by fixed pivot pins 100 and 102, respectively, on base structure 104 within second housing portion 50 and at the other end by moveable pivot pins 106 and 108, respectively, to support members 110 and 112, which are contained within and affixed to the inner walls of housing portion 48. By appropriate mechanical couplings, rotation of a socket member within guide member 114 is translated to movement of pivot pins 106 and 108, and thus support members 110 and 112 and to the right and left halves of module 10 away from and toward one another. As discussed more fully in application Ser. No. 484,681, this movement is effected by clockwise and counterclockwise rotation, respectively, of a tool carried on the end of a conventional hot-stick.

Figure 7:
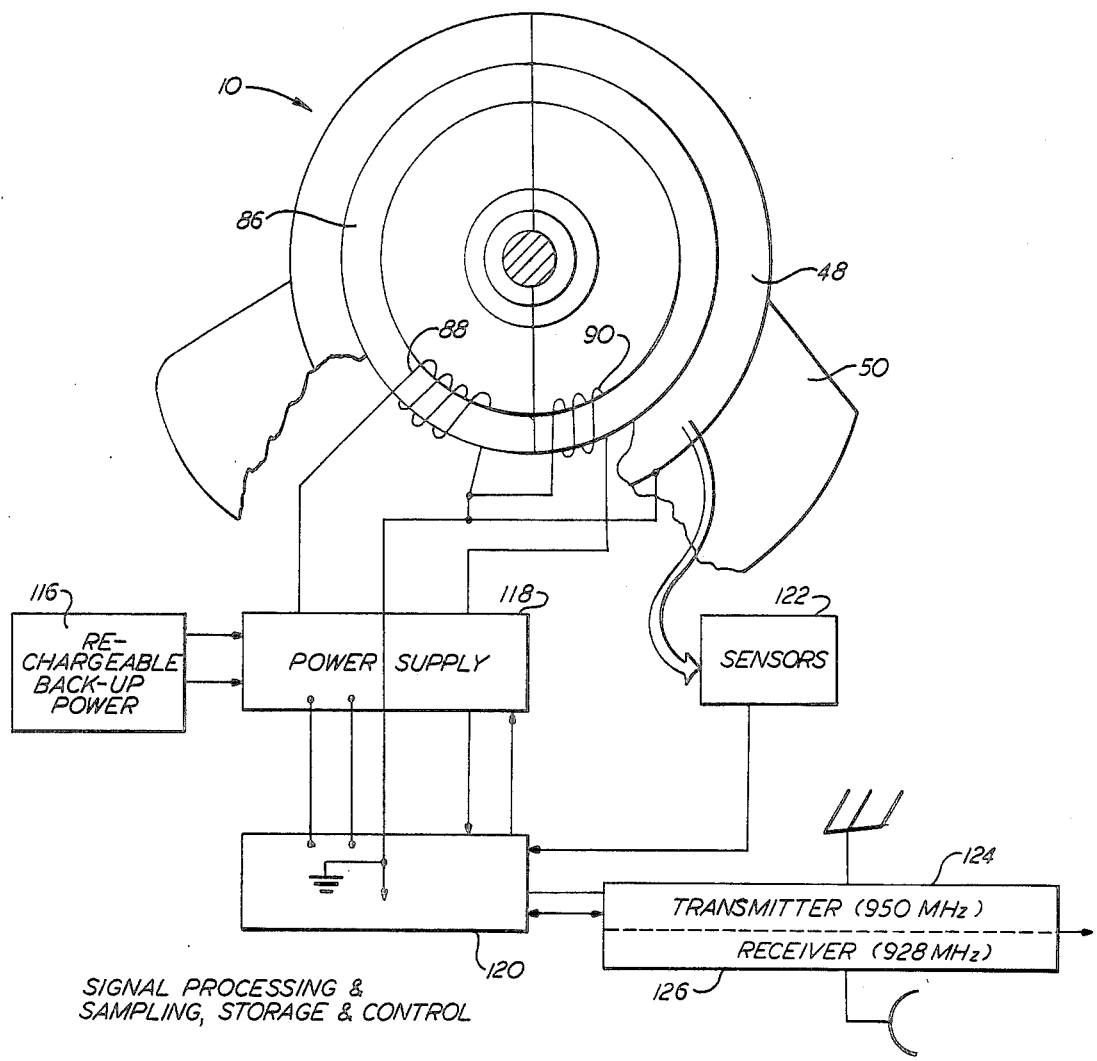
FIG. 7 is a diagrammatic block diagram of the sensor module subsystem components.

Turning now to FIG. 7, a general block diagram of the electronic subsystem components is shown in connection with an outline drawing of the module housing portions 48 and 50. In operation of module 10, only cylindrical housing portion 48 serves to collect charging current for the voltage sensor and for electrostatic charging of rechargeable batteries of subsystem 116, which includes the circuitry for recharging and controlling the use of back-up power as well as the batteries themselves. Power supply 118 receives electrical power from pick-off coils 88 and 90 when sufficient current is flowing through conductor 12, and otherwise from batteries 116, and supplies power at appropriate levels to signal processing subsystem 120. The elements for sensing the parameters to be measured, indicated collectively as subsystem 122, are connected to provide signals to subsystem 120, which in turn is connected to RF transmitter 124 and to receiver 126 in the embodiments which include the latter. These features are discussed more fully in companion application Ser. No. 859,496.

Figure 8:
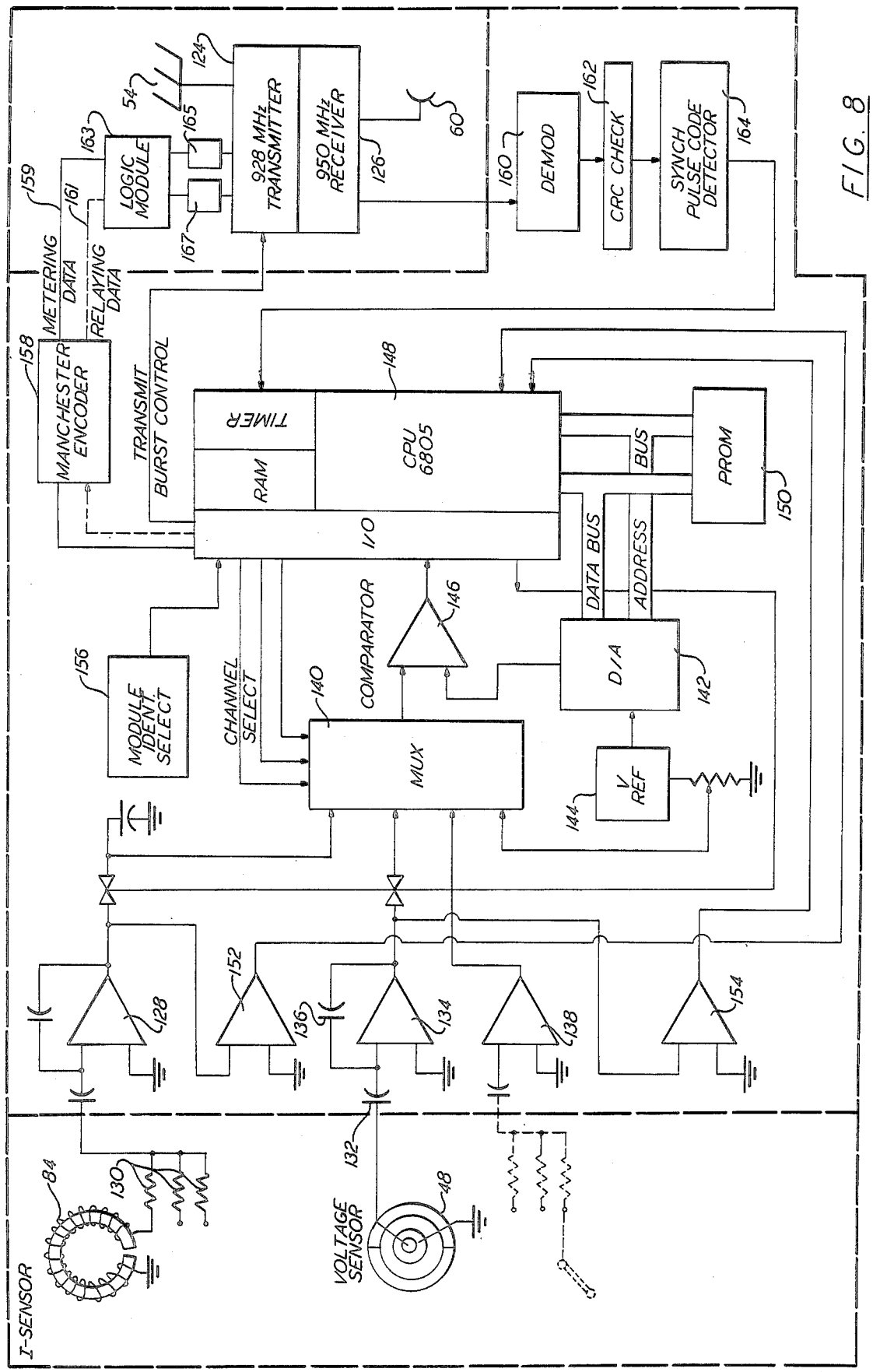
FIG. 8 is an overall schematic block diagram of the transceiver sensor module electronics.

Referring now to FIG. 8, current and voltage on the conductor at a predetermined point in time are sensed simultaneously by Rogowski coil 84 and housing section 48, respectively, in the manner previously described. Rogowski coil 84 is connected to input amplifier 128 through current range select resistors 130. The voltage sensor is connected through capacitor 132 to low impedance operational amplifier 134 with feedback capacitor 136, as previously described, to provide an output signal in phase with the line-to-neutral voltage. A novel means for improving the accuracy of voltage readings by compensating for the effects of adjacent, energized conductors is described later herein.

Additional amplifiers such as that indicated at 138 may be provided for measurement of additional parameters, such as conductor temperature, ambient temperature, conductor vibrations, etc. The output of each of the parameter-measuring amplifiers is connected through multiplexer 140 for comparison with the output of digital/analog converter means 142, which receives an input from voltage reference 144, at comparator 146, under the control of digital computer 148. The latter may be, for example, a Motorola CMOS 6805 microprocessor having I/O, RAM and timer components. Programmable read only memory 150 is connected to the computer CPU for storing the program.

Current and voltage zero crossing detection is provided by amplifiers 152 and 154, respectively, each having one input connected to the output of the respective current and voltage measuring amplifiers, and the other input connected to ground. The outputs of both zero crossing detectors are connected directly to microprocessor 148 for phase measurement. In addition to providing the signals necessary for measurement of phase angle and frequency (which is the inverse of the time between successive positive going zero crossings) the signals from voltage zero crossing detector 154 may be used for synchronization of data transmissions by transmitter 124 without requiring a receiver in the sensor module and a transmitter at the ground station.

Figure 3:
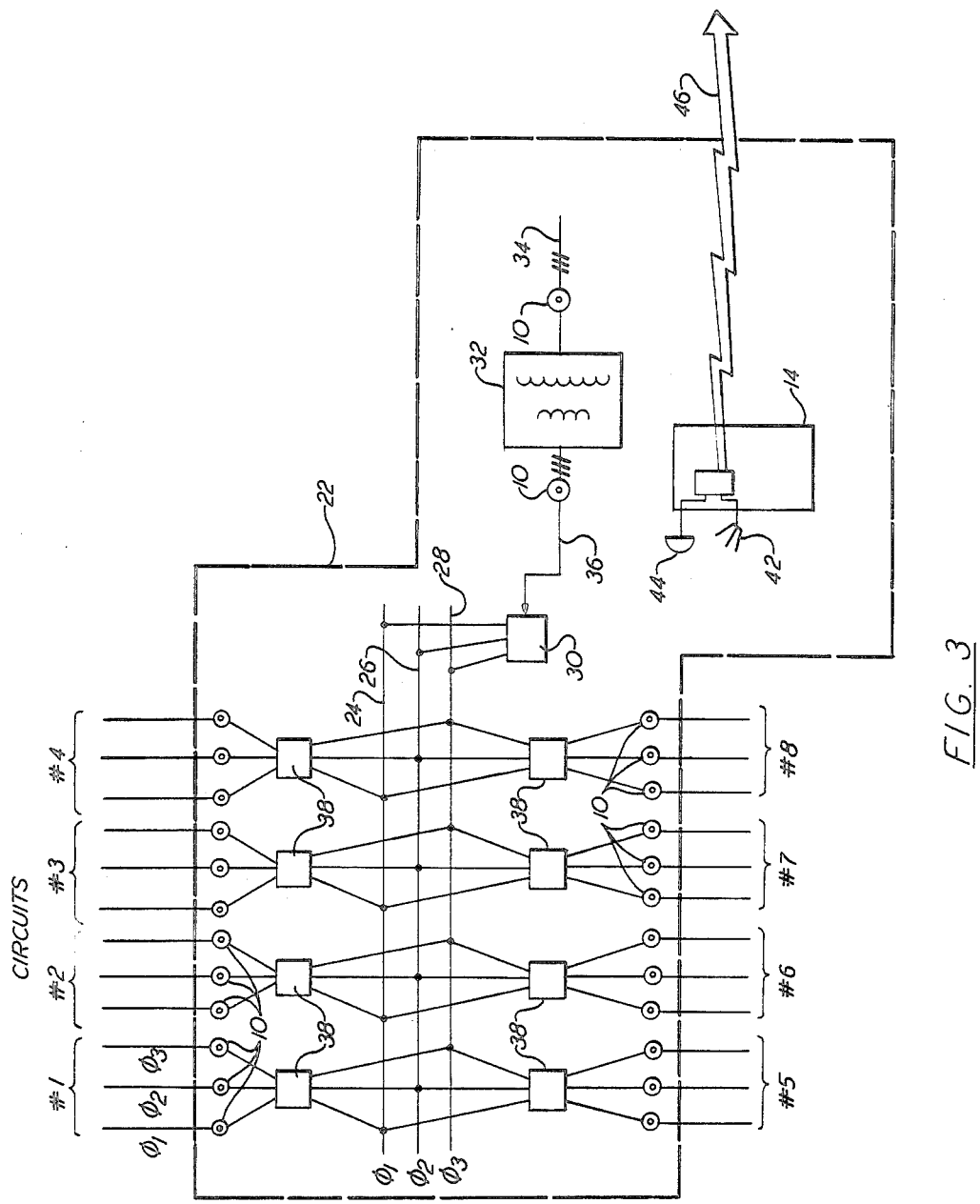
FIG. 3 is a diagrammatic illustration of the sensor modules mounted within a substation fence.

A transceiver system is shown which permits time synchronized, sequential data transmission from a relatively large number of modules, e.g., all modules necessary for monitoring an entire substation, such as that of FIG. 3, to a single ground station on a single broadcast frequency. The zero crossing detectors described in companion application Ser. No. 859,496 for controlling the timing of transmissions from the three modules of one circuit may also be used to provide basic synchronization with TDMA coded timing signals transmitted from the ground station and received at the module by receiver 126. Each module is assigned an identifying number which is selected initially through module 156. The digitized data representing the parameter values is assembled into appropriate messages, encoded in Manchester code by encoder 158 and supplied to transmitter 124 via line 159 for transmission in assigned time slots designated by TDMA data burst control signals received by receiver 126. The timing signals from the ground station are passed on from receiver 126 to demodulator 160 (which can be part of the receiver 126). The demodulated TDMA signal contains information on the assigned time slot for transmission by the particular sensor module. The signal is passed through CRC check module 162, for error detection and the pulse code is detected by module 164, providing the microprocessor with information to control the transmitter burst timing.

Sensor modules 10 are in a high voltage environment isolated from ground. It is desirable, therefore, to derive as much information as possible from the sensors within the system with a minimum of complexity and to transmit this raw data to the ground station for processing. Various derived quantities can then be calculated by the microprocessor CRTU ground station.

Figure 9:
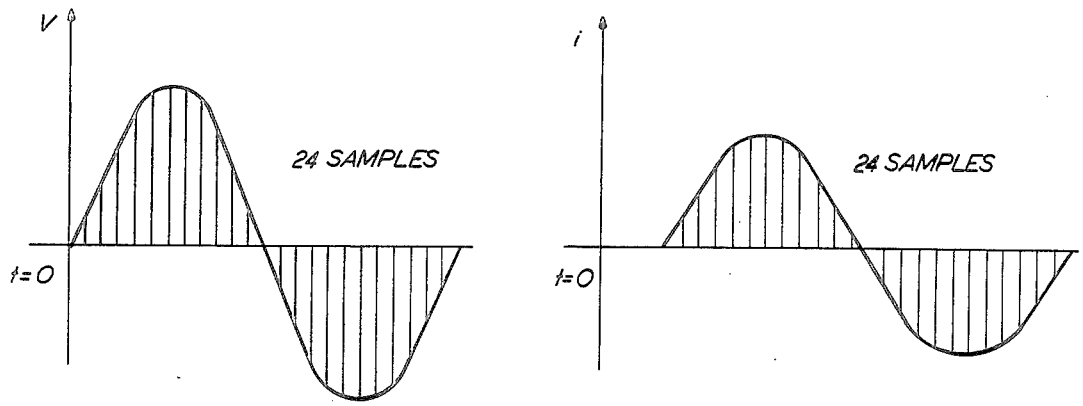
FIG. 9 is a diagram of the voltage and current waveform sampling, storage and comparison.

Because of the high data transmission rates provided by the TDMA technique, it is possible to sample and hold both current and voltage values 24 times per cycle, as indicated in FIG. 9. Fourier components may be calculated by the sensor module processor and values thereof transmitted to the ground station sequentially by pulse code modulation. Alternatively, the values of voltage and current sampled 24 times per cycle may be transmitted to the ground station and the Fourier components calculated therein. The RMS values of voltage, current and the phase angle may also be calculated within each module and the values directly transmitted to the ground station.

When it is desired to derive phase and harmonic data rather than merely transmitting the fundamental Fourier components of the voltage and current to the ground station, the shape of the waveforms and their relative phase must be transmitted. The ground station can then easily compute the quantities of interest, for example, RMS amplitude of voltage and current, their relative phase and harmonic content. Since current and voltage are sampled simultaneously, their relative phases are the same as the relative phases of the sample sequence. By using zero crossings of the voltage waveform for sample timing improved accuracy and stability is obtained. Zero crossing detection of the current waveform and the time difference between the voltage and current zero crossing provides a phase angle measurement check.

The data transmissions take place in e.g, 4.5 millisecond time slots at a data rate of approximately 20 kilobits/sec. Time slots of individual sensor modules are synchronized through a 950 MHz timing signal received simultaneously by all sensor modules in a station. This signal also contains address information as to the time slot allocation for the data burst from a particular sensor module. With this information all voltage, current, phase angle, power and energy measurements of the fundamental and harmonic components can be calculated by the ground station processor. For example, the fundamental Fourier components of voltage and current $V_A$, $V_B$ and $I_A$, $I_B$ are:

$$V_A = \frac{2}{S_T} \sum_{S=1}^{S_T} V_S \cos\left(\frac{2\pi}{S_T} \cdot S\right)$$

$$V_B = \frac{2}{S_T} \sum_{S=1}^{S_T} V_S \sin\left(\frac{2\pi}{S_T} \cdot S\right)$$

$$I_A = \frac{2}{S_T} \sum_{S=1}^{S_T} I_S \cos\left(\frac{2\pi}{S_T} \cdot S\right)$$

$$I_B = \frac{2}{S_T} \sum_{S=1}^{S_T} I_S \sin\left(\frac{2\pi}{S_T} \cdot S\right)$$

Where $S_T$ equals the total number of samples; in the apparatus disclosed this is 24. S equals the sample number, and $V_S$ and $I_S$ are values of measured voltage and current at sample S. From these RMS voltage V and current I may be derived from the standard formulas:

$$V = [(V_A)^2 + (V_B)^2]^{\frac{1}{2}}$$

$$I = [(I_A)^2 + (I_B)^2]^{\frac{1}{2}}$$

Real Power is:

$$P_R = (V_A \times I_B) + (V_A \times I_B)$$

and Reactive Power is:

$$Q_R = (V_A \times I_B) - (V_B \times I_B)$$

Referring to FIG. 3, a single large substation 22 may have over 100 sensor modules 10 transmitting data to a single receiver 24. Since frequency spectrum is difficult to obtain, data collisions must be avoided, and synchronized data is required for sequence-of-events applications, it is important that all sensor modules in a substation collect time synchronized data by receiving synchronizing signals through a transceiver configuration. This technique also permits high data transmission rates needed for relaying applications and harmonic measurements.

Again referring to FIG. 9, the timing diagram is shown where the voltage and current sine waves are measured by the voltage sensor and Rogowski coil. At the first zero crossing, labeled t=o, after receipt of the TDMA clocking signal, timing is started. Twenty four simultaneous voltage and current waveform samples are taken successively. The sampling interval is defined by equal segments within successive voltage zero crossings. These measurements are utilized to compute $V_A$, $V_B$, $I_A$ and $I_B$. The program loads shift registers with the identification number of the sensor module, auxiliary number, the Fourier components $V_A$, $V_B$, $I_A$, $I_B$, the digitized auxiliary parameters and the CRC (a check sum). At the allocated time slot for each sensor module established by the received TDMA synchronizing signal the Fourier components of voltage and current, frequency, phase angle and auxiliary parameters are transmitted. The process is repeated as the program is reset at the end of each transmission. All samples of voltage and current are stored for comparison with the next set as shown in Table 1.

With the high speed sampling afforded by the TDMA approach the same sensor modules can be used for relaying. Each string of samples starting with the voltage zero crossings is stored in RAM for comparison with the next string of samples at the same point in each waveform. If the deviations exceed the relay settings based on a predetermined initialization the data is immediately communicated to the ground station CRTU or a separate but simplified "Relay Ground Station" on one of eight emergency time slots provided in the TDMA burst stream. An alarm is simultaneously triggered. Alternatively, a second crystal can be switched in to transmit abnormal data on a second frequency channel available to all sensor modules on a random access basis.

Referring again to FIG. 8, the data communicated on line 159 from encoder 158 to transmitter 124 is that data required to perform the normal metering functions. A second line 161 may be provided for communicating data to perform relaying functions. In this case, both lines 159 and 161 are connected to logic module 163 which is adapted to disable the metering channel whenever a signal is present on relaying data line 161. First and second crystals 165 and 167 allow transmitter 124 to transmit metering and relaying signals on two, mutually exclusive channels, whereby the relaying data will always be received at the ground station even though another module may be transmitting at the same time on the metering channel. Preferably, a test signal is periodically transmitted on the relaying channel to ensure constant operability.

Abnormal conditions may be defined in a number of ways, e.g.
If:

$$0.8 < V_{tp}/V_{(t-1)p} \text{ or } V_{tp} > 1.2 \, pu$$

or $$i_{tp}/i_{(t-1)p} > 3 \, pu$$

an alarm is transmitted to the ground station.
Where,
$V_{tp}$ is the peak voltage for a sample set
$V_{(t-1)p}$ is the peak voltage for the previous sample set
$i_{tp}$ is the peak current for a sample set $i_{(t-1)p}$ is the peak current for the previous sample set.

Data may be transmitted in Manchester code or other conventional encoders. Each message comprises the latest measured Fourier components of voltage and current and another measured auxiliary parameter with a number identifying it. Thus, each message format for the fundamental and its harmonics would be repeated as follows:

| | |
|---|---|
| Sensor Module Identification | 4 bits |
| Auxiliary Parameter No. | 4 bits |
| Voltage Sine Component | 12 bits |
| Voltage Cosine Component | 12 bits |
| Current Sine Component | 12 bits |
| Current Cosine Component | 12 bits |
| Auxiliary Parameter | 12 bits |
| Cyclic Redundancy Check | 12 bits |

The auxiliary parameter rotates among each one on successive transmissions, e.g.

| Parameter No. | Parameter |
|---|---|
| 0 | Check Ground (zero volts nominal) |
| 1 | Check Voltage (1.25 volts nominal) |
| 2 | Sensor Module Interior Temperature |

Figure 10A:
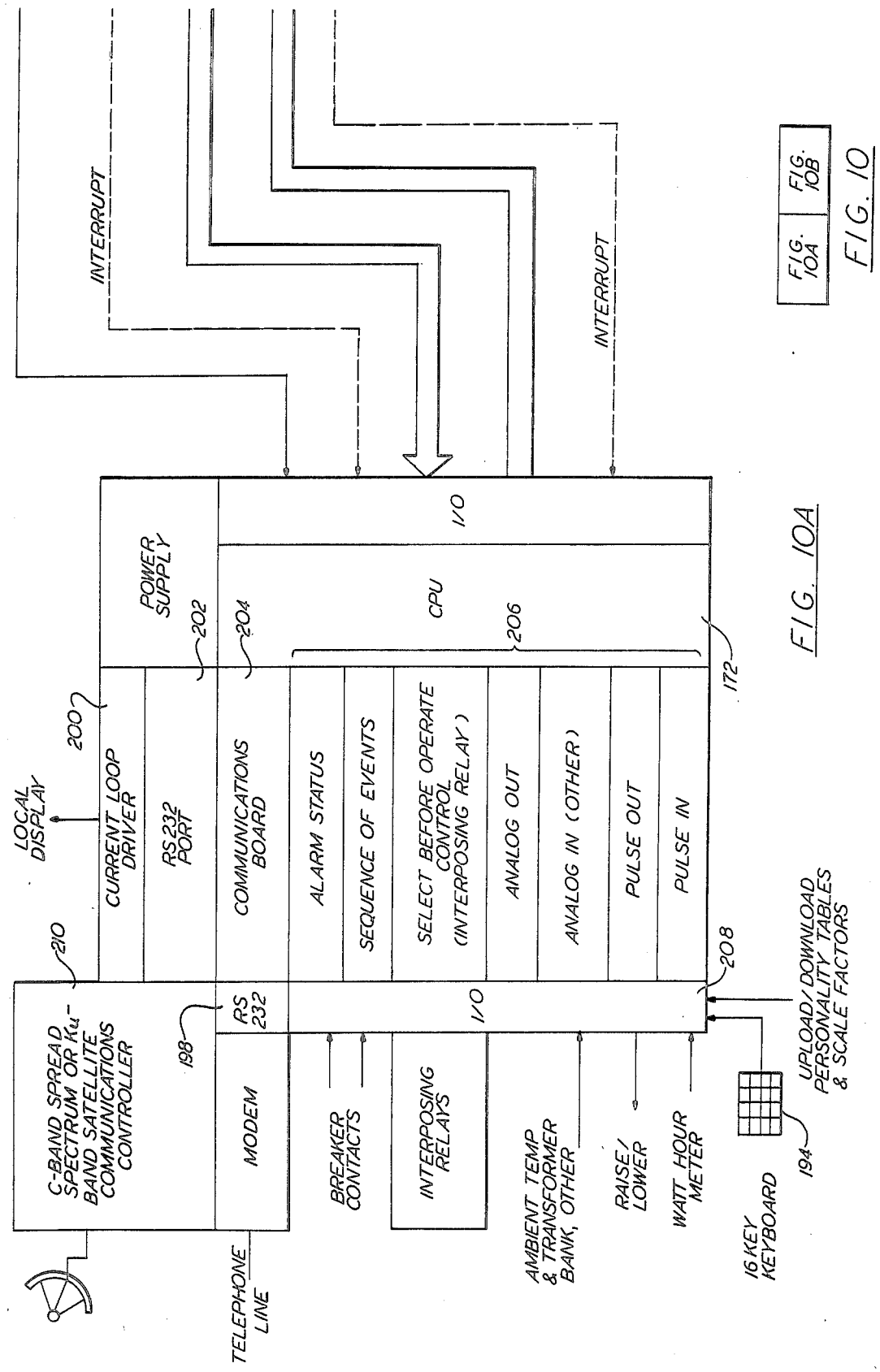
FIGS. 10A and 10B together form a block diagram of the Combined Remote Terminal Unit ground station utilized with the sensor modules.
Figure 10B:
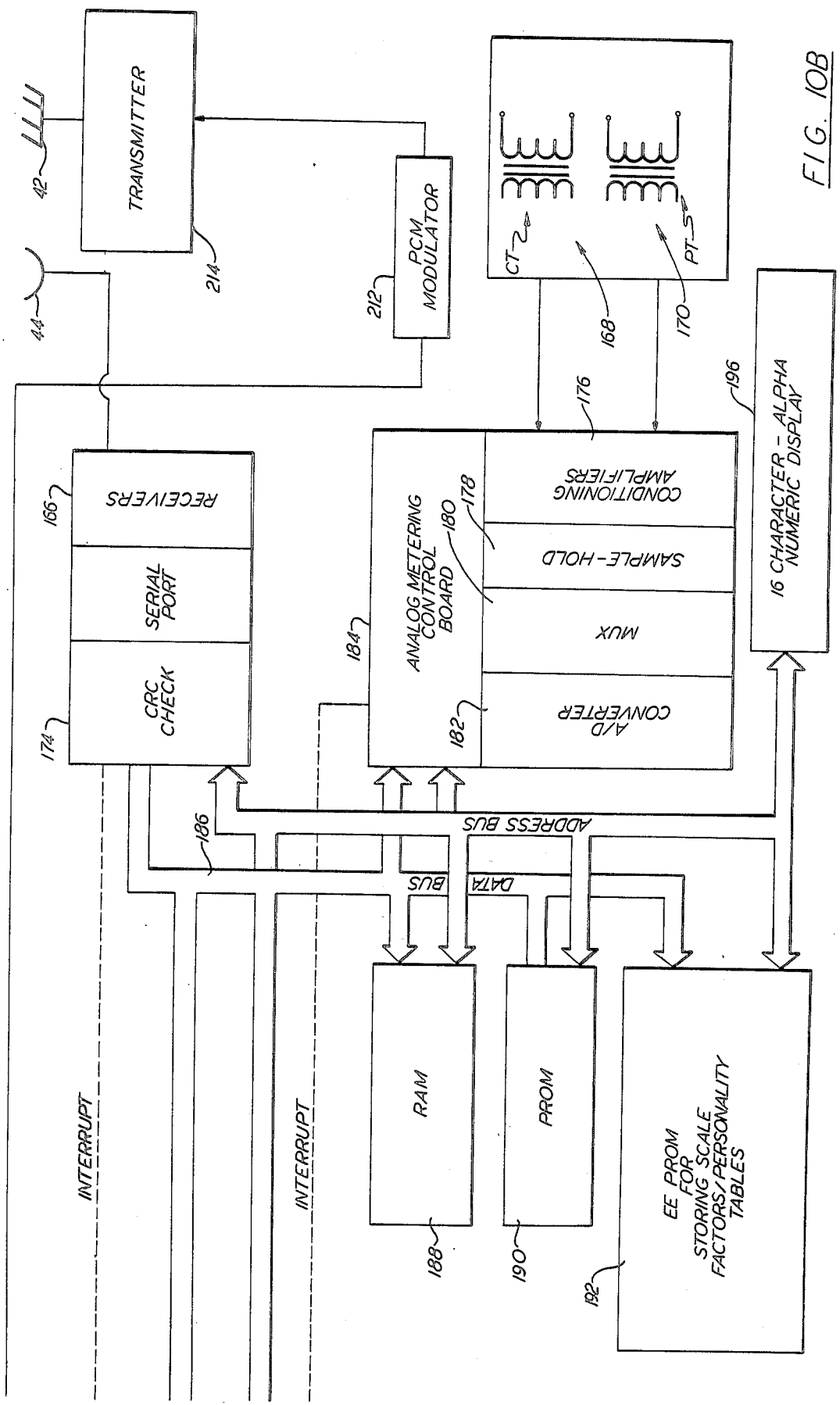

A block diagram of CRTU 14 of the present invention is shown in FIGS. 10A and 10B. It is important to note that CRTU 14 combines the non-metering functions of a conventional utility Supervisory Control And Data Aquisition (SCADA) system with the Remote Terminal Interface (RTI) capability of parent application Ser. No. 484,681. That is, a conventional SCADA system is employed at a power substation to monitor alarm status, receive control signal inputs from a central SCADA master computer or Energy Management System (EMS) computer, record the sequence in which substation relays operate, monitor analog signals associated with power transformer banks or underground cable (temperature, pressure, etc.), and other pulsed inputs and outputs. The RTI disclosed in application Ser. No. 484,681 provided signal processing means for performing metering functions in conjunction with the line-mounted sensor modules, and/or from analog signals associated with underground power cables through existing current and potential transformers. Lower overall system cost is achieved by combining these separate functions in the CRTU of the present invention, as will now be explained.

In addition to receiving transmissions from multiple sensor modules 10, via 928 MHz receiving antenna 44 and radio receiver 166 the CRTU system 14 can receive analog data from multiple current transformers 168 and potential transformers 170 not associated with the overhead lines. CRTU 14 is a microprocessor-based system operated by Central Processing Unit (CPU) 172, such as a type 68000 microprocessor or an 8386 Intel microprocessor. The coded transmissions from sensor modules 10 received by receiver 166 are transmitted through a CRC error check 174 before being processed by CPU 172. The input from current and potential transformers 168 and 170 are conditioned by conditioning amplifiers 176, sample and hold circuitry 178, multiplexer 180, and A/D conversion circuits 182, under control of analog metering control board 184. The digitized data is supplied on data bus 186 to CPU 172. CPU 172 is provided with RAM 188, PROM 190 for storing its program, and an Electronically Erasable Read Only Memory 192 for storing scale factors and personality tables.

CPU 172 is provided with keyboard 194 and a 16 character single line display 196. It is also provided with an RS232 port 198 for loading and unloading personality tables comprising scale factors and the like for the sensor modules and the inputs from transformers 168 and 170. CRTU 172 supplies data via current loop 200 from an RS232 communications port 202 on communications board 204 to a substation SCADA telemetering link, or for local display of data directly on an IBM XT or Compaq microcomputer screen. Complete, conventional non-metering SCADA function capability is provided by scanning inputs from substation pulse, analog, control (Select-Before-Operate), Sequence-of-Events, and Alarm Status signals, indicated collectively by reference numeral 206. These inputrs are connected directly to I/O interface 208 of CPU 172, with circuit breaker control performed through interposing relays operated by the Select-Before-Operate control port. CPU 172 is further connected, through I/O 208, to spread spectrum satellite controller 210 for two-way data communication to an EMS Master Control Center or SCADA Dispatch Center.

CRTU 14 also sends a TDMA coded synchronizing message, via pulse code modulator 212, Transmitter 214 and 950 MHz transmit antenna 42. This signal is received by all sensor modules and serves to synchronize transmission of data, as described in the concurrently filed application.

FIG. 11 indicates the type of data included in individual messages which are periodically receivedfrom each of sensor modules 10 at CRTU 14. This represents the data temporarily stored in an individual buffer, one of which is provided for each sensor module in the system. This data is then used to calculate desired output parameters including voltage, current, temperature, frequency, kilowatt hours, kilowatts, kVA, and KVAR's (Reactive Power). Each sensor module supplies the Fourier components of voltage and current which are used for calculating power, reactive power and energy related quantities. Items indicated in the word column are used to identify the processing status of data from the indicated sensor module.

FIG. 12 displays the scale factor table for each sensor module, such tables being stored in EE PROM 192. Note that there are 4 voltage scale factors, in order to enhance accuracy of voltage measurement depending on the status of adjacent circuits, i.e., whether adjacent conductors are energized.

In analog metering board 184 the analog inputs from current and potential transformers 168 and 170, respectively, are sampled in turn. After its condition has been converted to digital form, an interrupt is generated, and the data is supplied to data bus 186. It should be noted that analog board 184 causes the inputs from the current and potential transformers 168 and 170 to be sampled 24 times per cycle, just as current and voltage are sampled in sensor modules 10. Data supplied to data bus 186 from analog board 184 comprises 24 successive values over one voltage and current cycle. After all 24 values have been stored in Random Access Memory 188, and appropriate correction factors applied, the fundamental sine and cosine Fourier components are calculated, just as for sensor modules 10. From these all other quantities required are calculated and stored in RAM 188.

When CRTU 14 is initially set up, appropriate sensor module scale factors are loaded through RS232 port 202 into the Electrical Erasable Read Only Memory 192. The output personality table may be displayed on display 196 and entered by keyboard 194 or entered or read out through RS232 port 198. A common power supply is used for the integrated CRTU 14, thereby reducing cost and space requirements.

Figure 13A:
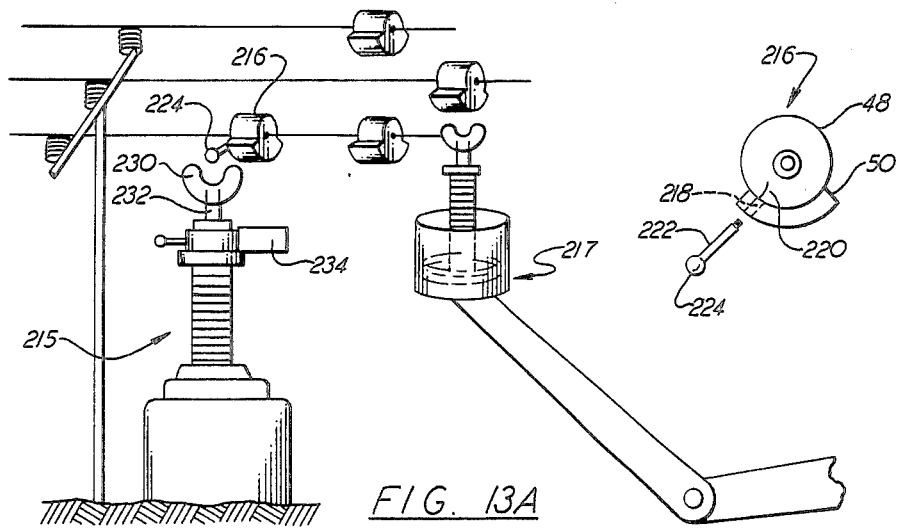
FIG. 13A is a diagrammatic illustration of apparatus used in field voltage calibration of the sensor modules.
Figure 13B:
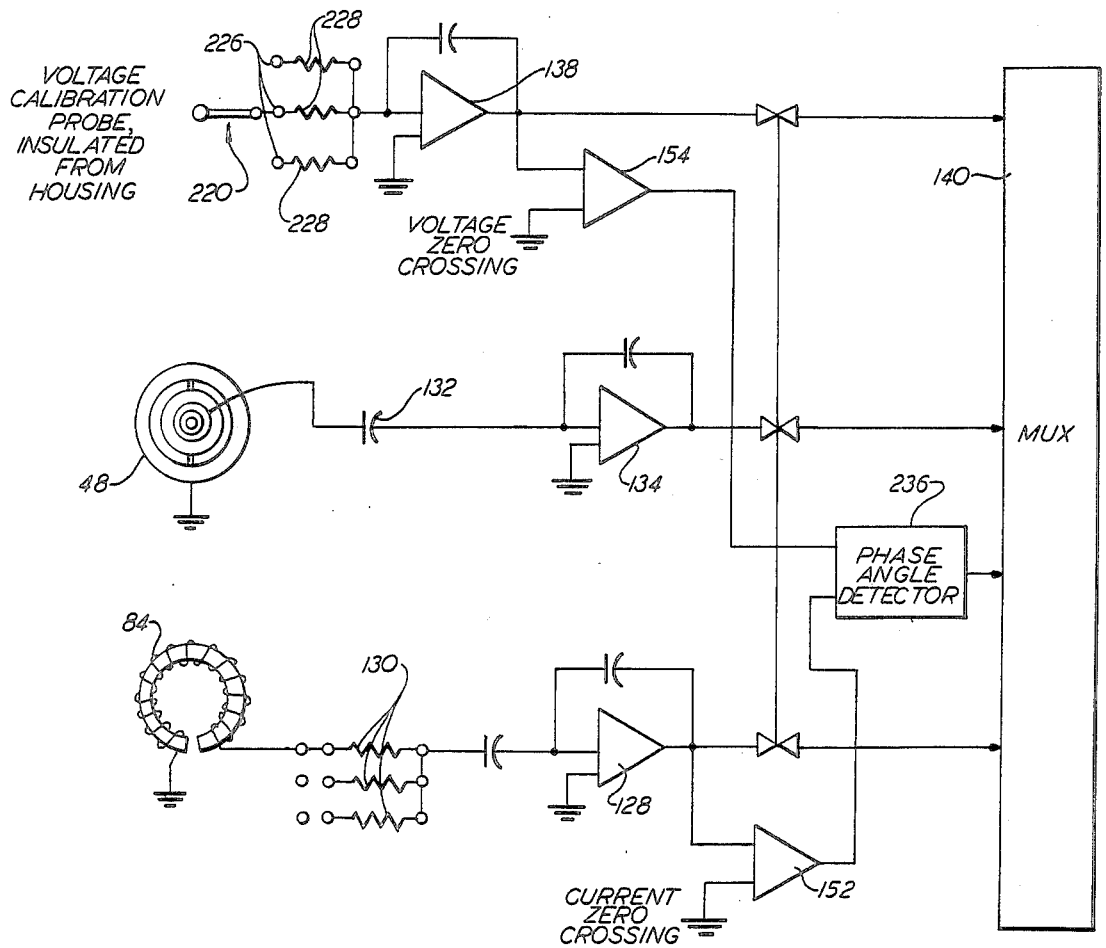
FIG. 13B is a schematic diagram of the electrical implementation of the calibration system of FIG. 13A.

In order to ensure that the signal indicative of line voltage transmitted to the ground station by the individual sensor modules accurately reflects the actual line voltage, it is necessary to calibrate the modules with a known calibration potential transformer. Depending upon circuit voltage, a ground potential transformer, such as indicated generally by reference numeral 215, FIG. 13A or, for voltages below 35KV, by a transformer mounted in an insulated bucket truck, as indicated at 217. Such calibration may conveniently be performed utilizing a line-mounted sensor module of the present invention with some very simple modifications. Sensor module 216 includes all physical and electrical features of modules 10 as previously described and, in addition, is provided with a threaded socket 218 in housing portion 50, connected by lead 220 to the circuitry within housing portion 48. Rod 222 is threaded into socket 218 at one end, and carries spherical probe 224 at the other end. Probe 224, rod 222 and socket 218 are all of electrically conducting material, whereby probe 224 is in electrical communication with one of terminals 226 (FIG. 13B) of range select resistors 228. Common reference numerals are used in FIG. 13B to denote circuit elements previously described in connection with FIG. 8.

When concave probe 230 is raised, by means of telescopic mount 232, operated manually or by radio controlled servo-motor 234, into conducting contact with spherical probe 224, the current flow through probe 230 to the winding of transformer 215 is directly proportional to the actual voltage on the line upon which module 216 is mounted. This current also is made to flow through the appropriate resistor 228 to the previously mentioned spare operational amplifier 138. The output signal of amplifier 138 is thus proportional to this current, and hence to the line voltage. The sensor module 216 electronics beyond the multiplexer 140 is identical to sensor module 10 electronics shown in FIG. 8. The normal voltage sensing means of sensor module 10 is provided by operational amplifier 134. Thus, the voltage measurements of the sensor module and of the calibration potentiometer from amplifiers 134 and 138 respectively, are processed through multiplexer 140 and the rest of the previously described circuitry.

Zero crossings of the calibration voltage signal determined by operational amplifier 154 and the current sensed by the Rogowski coil 84 are used to provide an accurate measurement of the line power factor angle through phase angle detector 236, provided for this purpose in calibration module 216. This is also processed and transmitted to the ground receiver in the same fashion as the other signals. Both voltage and phase angle measurement is repeated for each phase, by mounting module 216 on each individual line, and the calibration factors are entered into the personality table for the particular circuit at the ground station.

Figure 14:
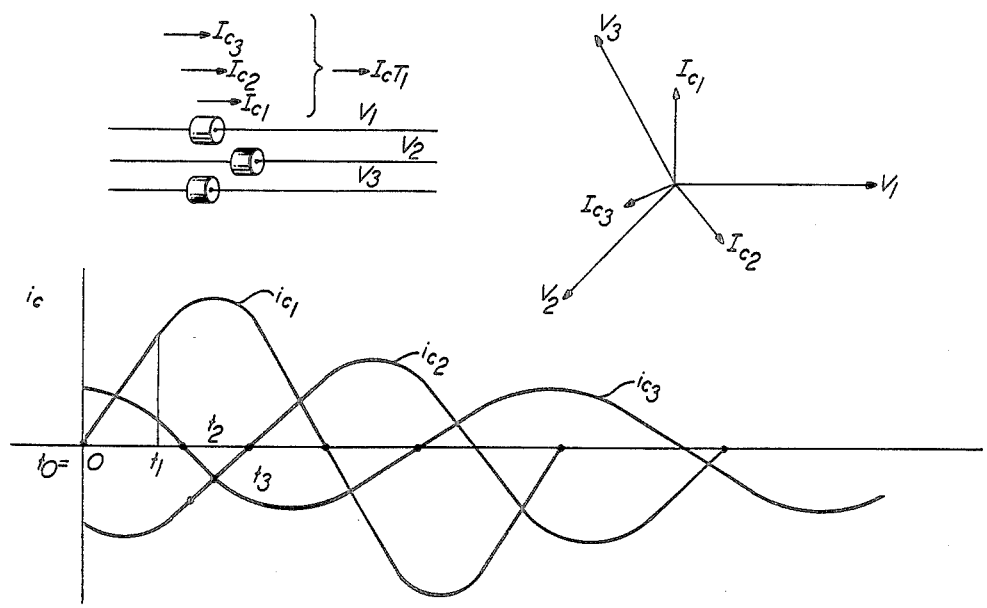
FIG. 14 is a composite graphical representation related to the explanation of error elimination in voltage measurement.

An alternative voltage calibration procedure is described below with respect to FIG. 14. Due to the proximity of the other conductors, each sensor module collects charging currents from adjacent phases. For example, the sensor module mounted on phase 1, in addition to collecting the desired phase one charging current $^ic_1$, collects phase two and three charging currents $^ic_2$ and $^ic_3$. The effects of these unwanted charging currents must be measured and eliminated in the calibration procedure. With the transceiver sensor modules and the TDMA synchronizing signals this is efficiently achieved by measuring the total charging current (the vector sum of $i_{c1}$, $i_{c2}$, and $i_{c3}$) on a given conductor at precise time intervals, as indicated below. After the frequency is determined through measurement of successive zero crossings of the voltage waveform, as previously described, the total charging current of sensor module 10 is measured at $t_1 = 60° \div 2\pi f$, $t_2 = 90° \div 2\pi f$ and $t_3 = 120° \div 2\pi f$. The total charging current measured at these times (with reference to the zero crossing) is held in RAM by the processor when the coded TDMA signal received by the sensor module processor puts the processor in this calibration mode.

The total charging current due to the phase one voltage alone, denoted $^Ic_1$ is obtained by solving the following equations:

$$i_{c1m}/wt = 60° = {}^Ic_1 \sin 60° - {}^Ic_2 \sin 60° \quad (1)$$

$$i_{c1m}/wt = 90° = {}^Ic_1 - {}^Ic_2 \sin 30° - {}^Ic_3 \sin 30° \quad (2)$$

$$i_{c1m}/wt = 120° = {}^Ic_1 \sin 120° - {}^Ic_3 \sin 60° \quad (3)$$

$^Ic_{1m}$ is the phase one charging current measured by the voltage sensor. From the 3 sampled measurements $I_{c1}$, the charging current due to voltage $V_1$ alone is calculated. From the relationship $V_1(actual) = I_{c1}V_{1m} \div I_{c1m}$, where $I_{c1}$ is obtained by solving equation (1), (2) and (3). The calibration factor $$k_{V1} = I_{c1}/I_{c1m}.$$

By calculating $I_{c2}$ and $I_{c3}$ from the above data the voltage phase angle error introduced by the charging currents $i_{c2}$ and $i_{c3}$ on phase 1 can also be established. The actual voltage then relates to the measured voltage by the equation:

$$V_1(actual) = k_{V1} \cdot V_{1m}.$$

For ultimate accuracy in voltage measurements under all circuit conditions, all adjacent circuit data must be recorded in the CRTU 14 as such. When there are two adjacent circuits there are 4 scale factors for voltage which are applied based on detection of whether:
 1. both adjacent circuits are energized,
 2. only phase 1 adjacent circuit is de-energized,
 3. only phase 2 adjacent circuit is de-energized, or
 4. both adjacent circuits are de-energized. These factors are stored in the CRTU 14 electronically eraseable PROM as shown in FIG. 12 for each sensor module voltage measurement, and the applicable scale factor is applied to each voltage measurement depending on the state of adjacent conductors.

Figure 15B:
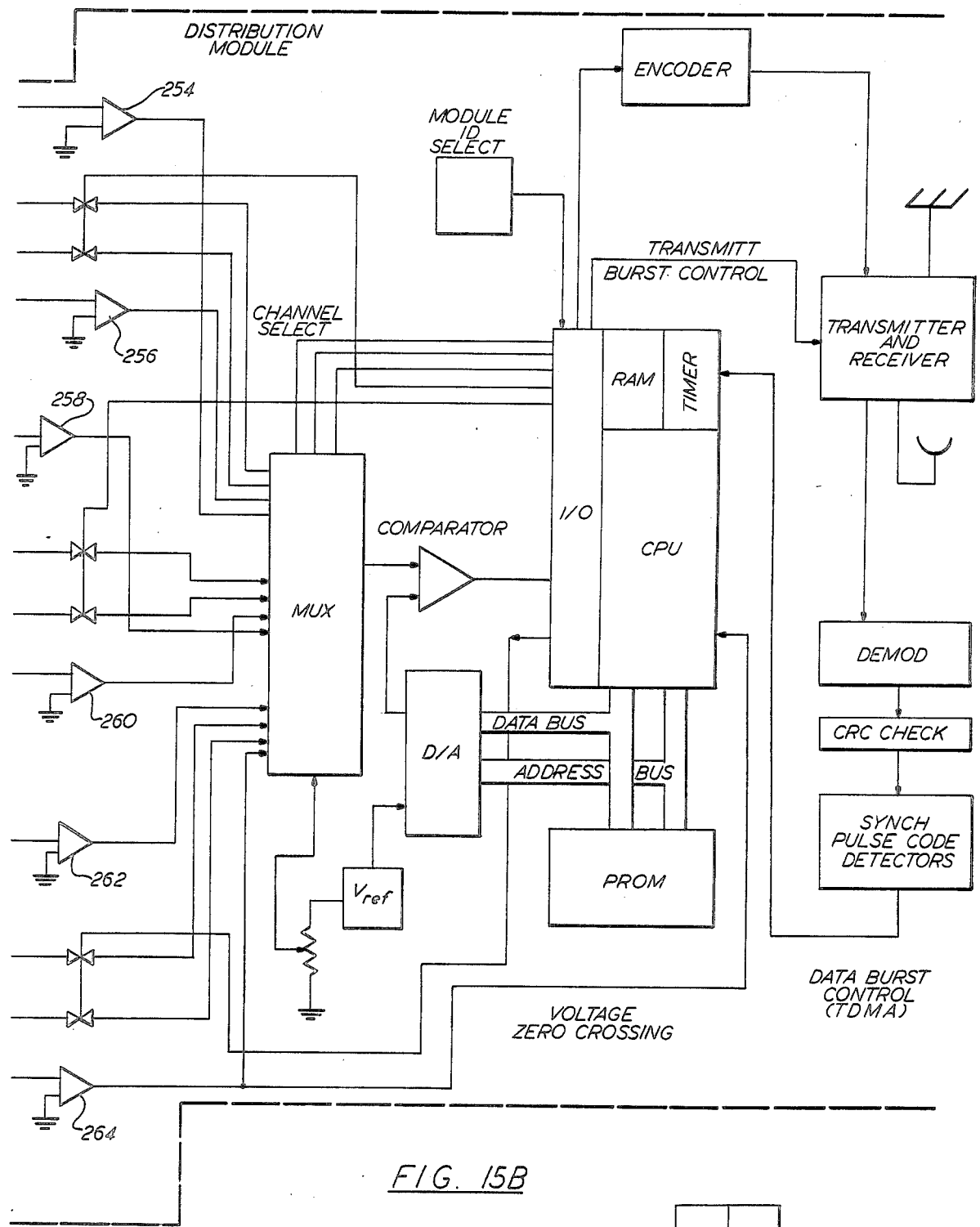
FIGS. 15a and 15b, is a schematic block diagram of a common three phase transceiver with fiber optic communications interface to the transceiver sensor modules.
Figure 15A:
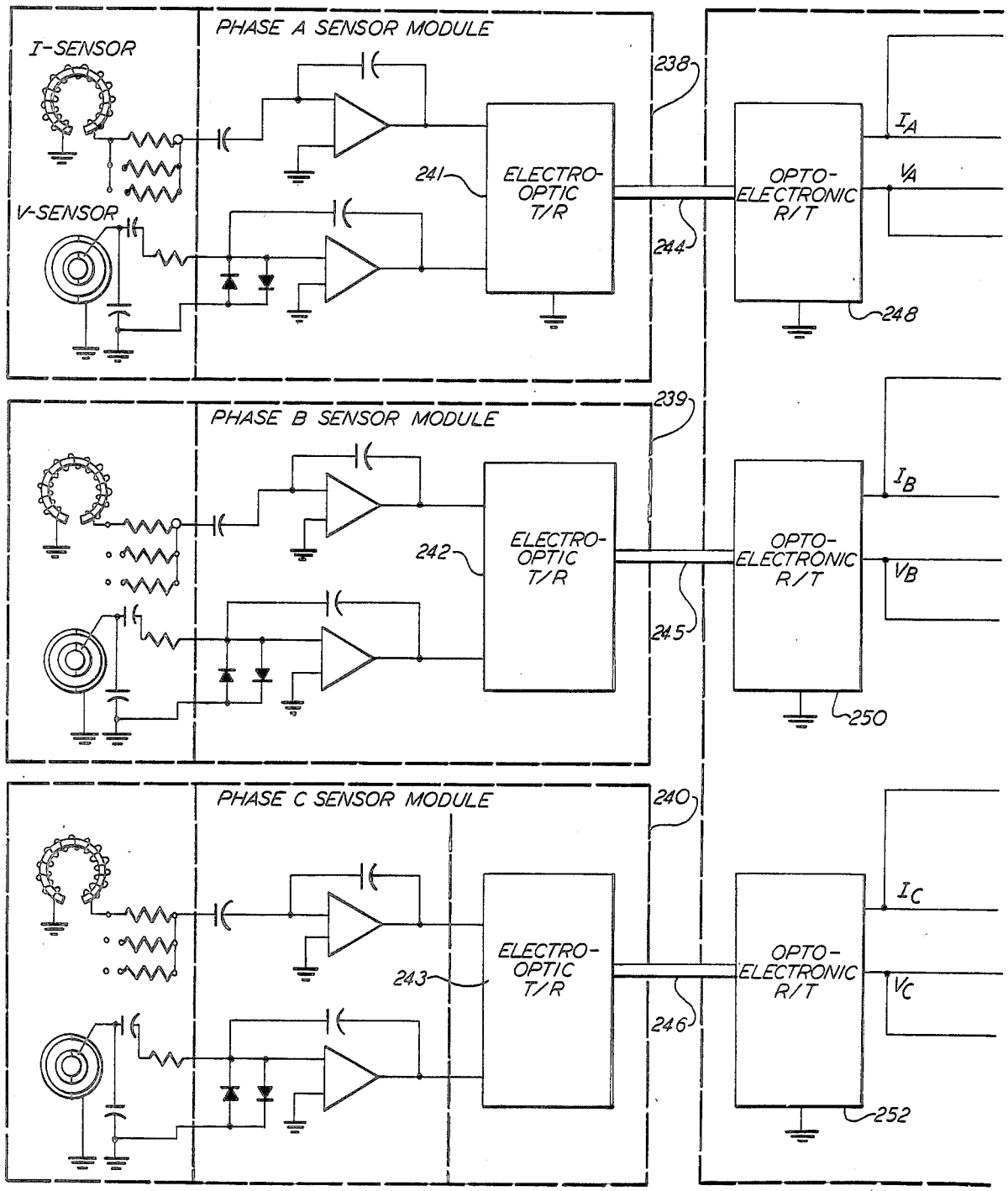

Overall costs and complexity of individual distribution feeder transceiver sensor modules can be reduced through the use of fiber optic communications between individual transceiver sensor modules and a common electronics signal processing, synchronization pulse code detector, timing, storage, program control and transmitter/receiver burst control system common to all 3 phases. This option was previously mentioned and a physical description of the sensor module mounting given in connection with FIG. 1B. A block diagram of the interconnection and operation of a system employing fiber optic links is shown in FIG. 15 wherein individual sensor modules 238, 239 and 240 are shown for each phase. These modules contain the basic Rogowski coil current and insulated housing voltage sensors. The individual current and voltage analog signals are converted through commerically available electro-optic circuitry 241, 242, 243, in modules 238, 239 and 240, respectively, to optical signals which are transmitted via optical fiber cables 244, 245 and 246 to opto-electronic receivers 248, 250 and 252. These opto-electronic receivers are housed in a separate sensor module 18 (FIG. 1B) which carries zero crossing current and voltage detect op-amps 254, 256, 258, 260, 262 and 264. The latter are all connected to the common multiplexer and remaining circuitry which is the same as that of the individual sensor modules previously described and shown in FIG. 8. For each phase, current and voltage analog signals are measured by the Rogowski and voltage sensor coils, converted into optical signals and transmitted as analog signals to the common 3-phase transceiver module 18 via fiber optic termination ferrule receptacles 11. The power supply module for the individual phase sensor modules and the common transceiver module is as described in connection with the module configuration of FIG. 1A. In common 3-phase sensor module 18 the optical signals are converted to electronic signals. The zero crossings for current and voltage measurements are monitored by the respective op-amps and fed to the multiplexer. All of the 3-phase signals are transmitted through the comparator to the microprocessor in common module 18, and processed as previously described. Voltage zero crossings are used to control sampling in conjuction with the transmit burst control signal which is enabled upon receipt of the data burst control TDMA signal. Alternatively, analog electrical signals from individual circuit phase sensor modules can be communicated as analog optical signals through fiber optic cables to the CRTU 14 that is located in the substation control house, thereby eliminating all radio links. Here, the optical signals are converted to electronic signals and processed in the manner previously disclosed.

Figure 16:
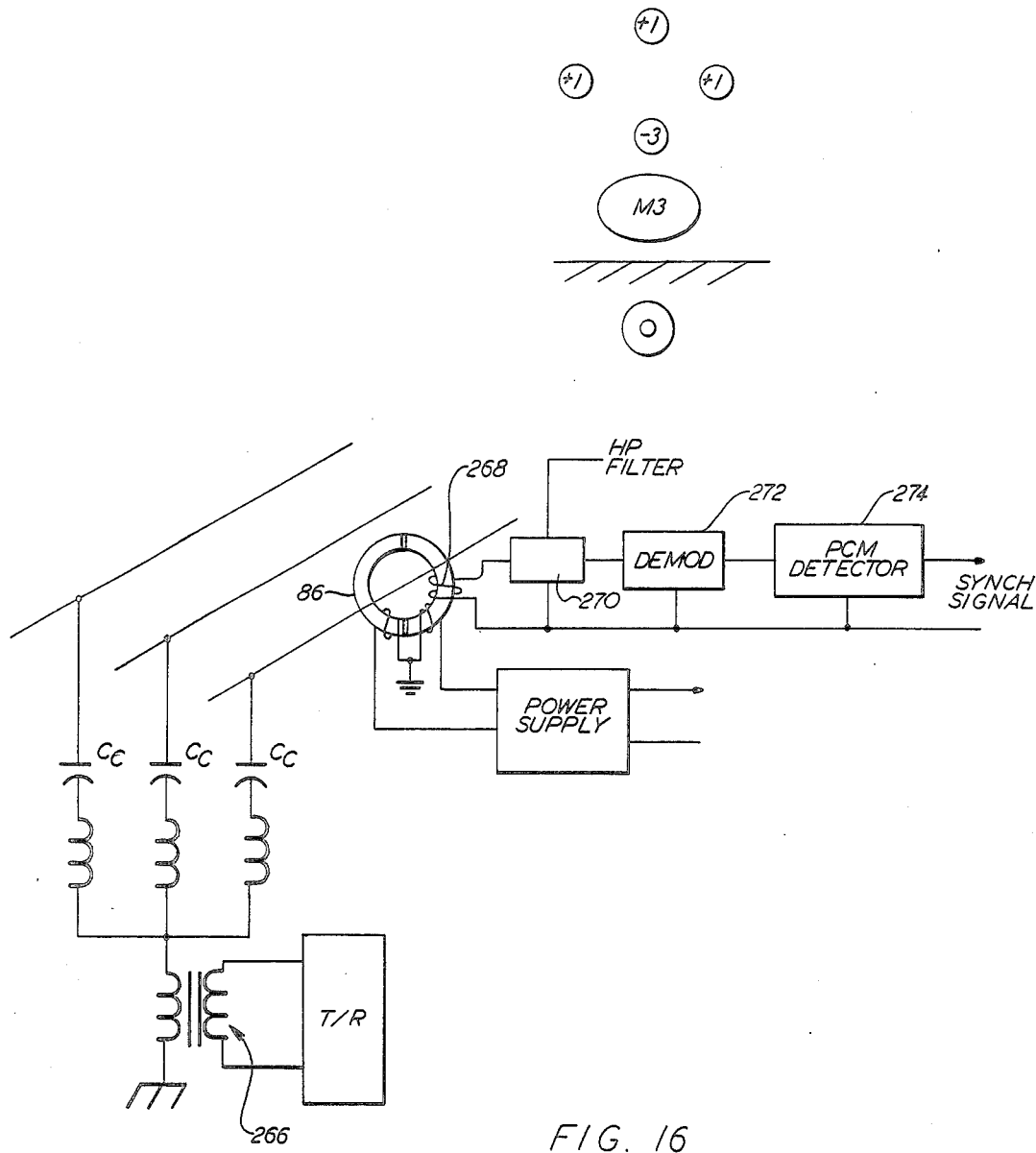
FIG. 16 is a schematic block diagram showing signal generation for distribution power line carrier transceiver sensor module synchronization with neutral injection of the Power Line Carrier signal.

An alternative to FM (950 MHz) or broadcast FM subcarrier synchronization would be the injection of a 7–30 khz power line carrier (PLC) signal FIG. 16. The PLC signal is pulse code modulated, for example, by mode 3 coupling, as shown, through the transformer bank neutral 266 feeding the substation buses and hence the circuits to be monitored. The PLC signal is detected by an inductive pick-up 268 on the split core 86 of the sensor module 10. The signal is filtered by a high-pass filter 270, to remove 60 Hz components of the power line, demodulated by demodulator 272 and the synchronizing signal detected by PCM detector 274. The sensor module processor timing sequence is initiated upon detection of the synchronizing signal message. The remaining operation of the sensor module is the same as for the FM synchronizing approach.

With this technique the FM receiver on the sensor module is not required. If the optical data transmission technique is utilized for the link to the CRTU 14 from the sensor module, the need for an FCC license is eliminated.

It is further pointed out that the compact sensor modules 10 disclosed herein may be synchronized with respect to initiation of transmission of 4.5 millisecond signal bursts by the means disclosed in the related application filed concurrently herewith. That is, synchronization may be effected by using the voltage zero crossings and inherent phase shift wt=120° for voltage zero crossings of adjacent phases. Adjacent circuits can then transmit every 7th, 11th, 13th, 17th and 19th cycle, with reference to the voltage zero crossing of circuits connected to the same bus. This eliminates the need for a receiver in the sensor modules, and a transmitter at the ground station.

Figure 17:
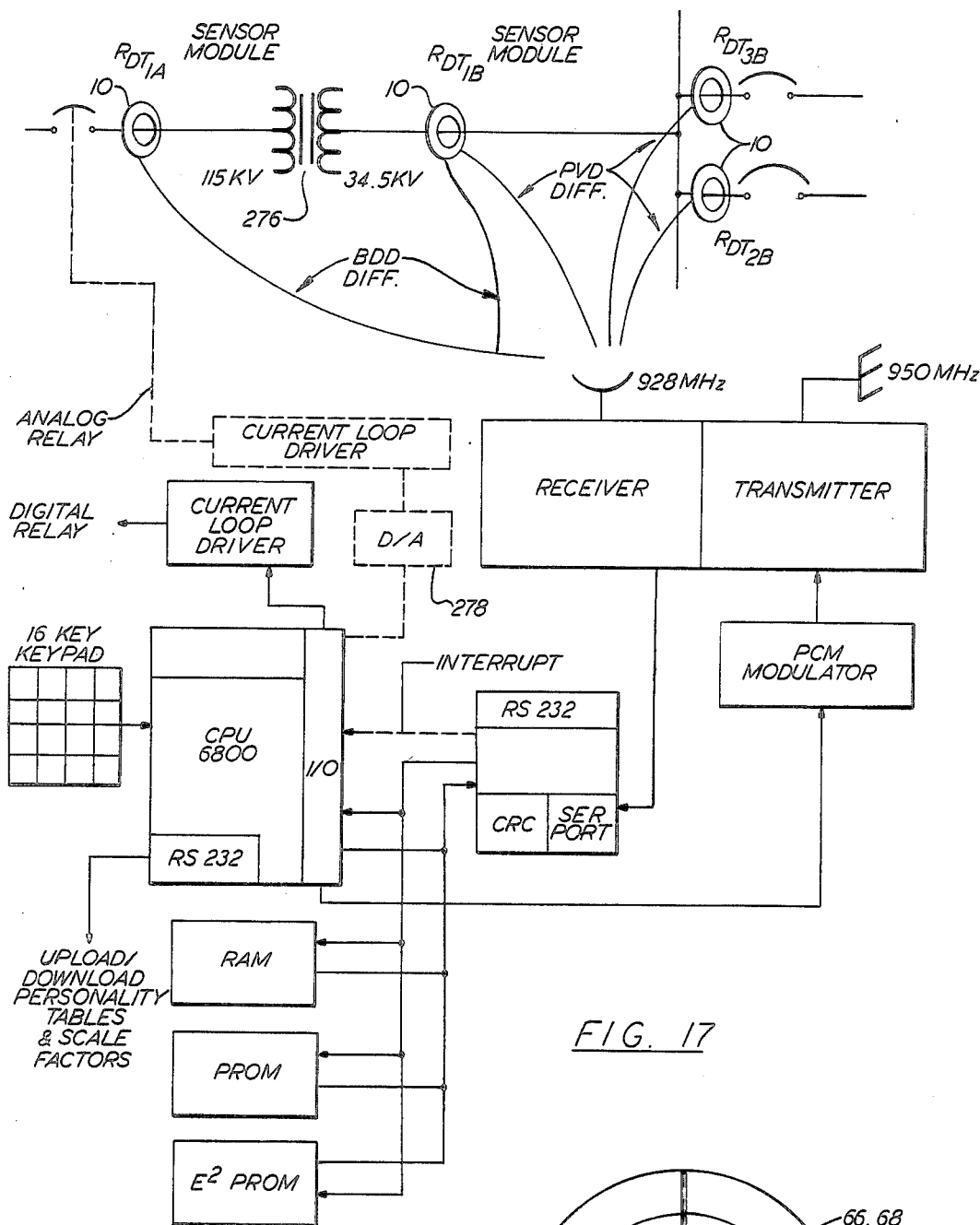
FIG. 17 is a schematic block diagram of a differential relay protection system incorporating the transceiver sensor modules.

The transceiver sensor modules can be applied for differential relay protection, as indicated in FIG. 17, since all the voltage and current samples are collected in one cycle with this approach. Sensor modules 10 indicated by the notations $R_{DT1A}$ and $R_{DT1B}$ (in accordance with conventional differential transformer bank relay protection notation) are mounted on the primary and secondary sides of transformer bank 276. These modules replace the current transformer inputs of a power transformer bank differential relay. The current signals of sensor modules $^R DT_{1A}$ and $^R DT_{1B}$ are recieved by CRTU 14 and compared in the microprocessor. If there is a need to provide a separate relaying ground station due to utility operating practices, the CRTU for the relaying function alone may be simplified to the form shown in FIG. 17. The differential current signal measured, if above the relay setting, is used to drive a digital relay. Alternatively, the digital signal is converted in D/A converter 278 and used to actuate an analog relay. The RF signals to and from the individual sensor modules can be replaced by an optical cable, and converted to analog electrical signals that drive a differential op-amp which provides a driving signal for a differential relay circuit above a pre-determined threshold. As also shown in FIG. 17, bus differential relay protection can be performed in a similar manner by communicating the current signals from sensor modules $^R DT_{1B}$, $^R DT_{2B}$ and $^R DT_{3B}$ (and other sensor modules connected to the same bus) to the same ground station and comparing the signals digitally to determine if the difference exceeds a pre-set threshold.

Figure 18:
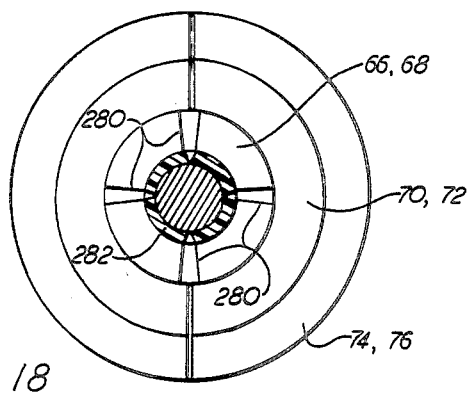
FIG. 18 is an elevational view of a transceiver sensor module hub for use on insulated, overhead conductors.

If the transceiver sensor modules are to be mounted on insulated distribution conductors, a special hub is used. Such a hub is shown in FIG. 18, having sharp metal protrusions 280 extending from hub inner ring 70, 72 (FIG. 5), through insert 66, 68 to pierce the conductor insulation 282 and to provide a conducting path between the inner ring 70, 72 and the conductor. Alternatively, a bucket crew using rubber gloves could mount the sensor module over a stripped portion of the conductor.

What is claimed is:

1. A compact system for installation on and removal from energized AC power conductors and accurately measuring the voltage on each of a plurality of AC power conductors, said system comprising:
   (a) a plurality of sensing means one of which is mounted upon each of said conductors and including means to measure said conductor voltage simultaneously by all of said sensing means at a plurality of predetermined times;
   (b) signal transmitting means associated with each of said sensing means to transmit signals commensurate with said conductor voltage at each of said predetermined times; and
   (c) signal receiving and processing means for receiving said transmitted signals and calculating there-from the tue value of said voltage on each of said conductors after correcting the received signal for any influence of adjacent conductor on said measured voltage.

2. The invention according to claim 1 wherein said sensing means includes a metallic housing mounted in surrounding relation to and conductively isolated from the associated conductor, upon which it is mounted whereby a charging current is present on said housing due to the electrostatic field of said associated conductor, and said conductor voltage is measured by sensing said charging current.

3. The invention according to claim 2 wherein said influence of adjacent conductors comprises the charging current present on said housing of any one of said sensing means as a result of the electrostatic field of any conductors adjacent to said associated conductor.

4. The invention according to claim 3 wherein said energized conductors have at least one adjacent conductor which may be energized or deenergized and said processing means includes scale factor storage means responsive to the state of energization or deenergization of each of said adjacent conductors.

5. A system for monitoring the rate of change of a cyclically variable parameter of an energized electrical power conductor and for actuating ground station control means in response to a predetermined abnormal rate of change of said parameter, said system comprising:
(a) a sensor module for mounting upon and removal from said energized conductor, and carrying means for sampling the value of said parameter at each of a plurality of evenly spaced times within each cycle of said parameter, and for storing the sampled values;
(b) means carried by said module for comparing said stored values with the sampled values at corresponding points in successive cycles of said parameter and determining whether the difference between said sampled values and said stored values indicates said predetermined abnormal rate of change;
(c) means carried by said module for transmitting an alarm signal in response to said abnormal rate of change; and
(d) ground receiver means remote from said module for receiving said alarm signal and actuating said control means in response thereto.

6. The invention according to claim 5 wherein said transmitting means includes means to transmit signals on either of first and second transmission channels, and means responsive to said comparaing means to cause said transmitting means to transmit on said first and second channels when said difference indicates the absence and presence, respectively, of said abnormal rate of change.

7. The invention according to claim 6 wherein said transmitting means comprises an RF transmitter having at least two crystals for respective transmissions on said first and second channels.

8. The invention according to claim 7 wherein said remote means includes means for receiving and processing signals transmitted on each of said first and second channels, and for actuating said control means in response to signals received on said second channel.

9. The invention according to claim 8 and further including means to disable transmission on said first channel, thereby permitting immediate transmission on said second channel, in response to said abnormal condition.

10. The invention according to claim 5 wherein said module further includes means for varying the duration of said evenly spaced times, and thereby the interval of said sampling, to sample at shorter intervals in response to said parameter varying at said predetermined abnormal rate of change.

11. The invention according to claim 10 wherein the number of samples within each cycle is variable in response to a predetermined rate of change of said parameter within a cycle.

12. The invention according to claim 11 wherein the number of samples within each cycle is increased by a predetermined multiple in response to a predetermined increase in the rate of change of said parameter.

13. The invention according to claim 10 wherein said sampling means is constructed and arranged to sample at least one harmonic of said parameter, and said sampling interval is proportionate to the frequency of the harmonic being sampled.

14. The invention according to cliam 5 wherein said control means comprises means for actuating operator alarm means.

15. The invention according to claim 14 wherein said operator alarm means comprises a remote telemetering interface for communicating said alarm signal to a location remote from said ground receiver means.

16. The invention according to claim 5 wherein said control means comprises a relay actuable to interrupt the circuit including said power conductor.

17. The invention according to claim 5 wherein said transmitting and receiver means comprise a fiber optic communications link.

18. A system for wireless sensing of current differential across the primary and secondary windings of a power transformer bank to provide differential relay protection of said power transformer bank, said system comprising:
(a) a sensor module for mounting upon and removal from each of the energized conductors which are connected to said primary and secondary windings, said modules carrying means for measuring the current flowing through its associated conductor;
(b) means for causing said modules to measure the current on its associated conductor simultaneously;
(c) means for transmitting signals from said modules commensurate with the value of current measured thereby;
(d) means remote from said modules for receiving and comparing said signals all within the time contraints required for effective differential relay protection; and
(e) means for operating a differential relay in response to the difference between said compared signals exceeding a predetermined threshold level.

19. The invention according to claim 18 wherein said time constraints comprise a time period not greater than that of 3 successive cycles of said current.

20. The invention according to claim 19 wherein said remote means further includes means for transmitting time-synchronizing signals, and said modules include means for receiving said time-synchronizing signals and for measuring said current and transmitting said signals commensurate with the value of current at times established by said time-synchronizing signals.

21. The invention according to claim 20 wherein said time-synchronizing signals are transmitted through the air.

22. The invention according to claim 20 wherein said means for transmitting said time-synchronizing signals comprise means coupling said remote means with said power conductors and said time-synchronizing signals are transmitted using power line carrier injection.

23. The invention according to claim 20 wherein said means for transmitting and receiving at least one of said time-synchronizing signals and said signals commensurate with the value of current comprise fiber optic communication links.

24. A system for wireless sensing of current differential on first and second pluralities of electrical conductors carrying current to and from, respectively, a singled bus to provide differential relay protection of said bus, said system comprising:
(a) a sensor module mounted upon each of the conductors of said first and second pluralities, said modules carrying means for measuring the current flowing through its associated conductor;
(b) means for causing all of said modules to measure the current on its associated conductor simultaneously;
(c) means for transmitting signals from said modules commensurate with the current measured thereby;
(d) means for receiving and comparing said signals from modules on said first plurality of conductors with signals from modules on said second plurality of conductors; and
(e) means for operating a differential relay in response to the difference between said compared signals exceeding a predetermined threshold level.

25. An integrated system for performing metering functions by both wireless and hard-wired sensing means at an electrical power substation, said system comprising:
(a) a plurality of individual sensor modules each mounted upon one of a first plurality of power conductors at said substation, each of said modules including means for simultaneously measuring each of a plurality of variable parameters, including d voltage and current, associated with operation of said first conductors;
(b) means for time-synchronizing the measurement of said parameters by said plurality of modules, whereby each of said modules measures the value of the same parameter at the same time on its associated conductor;
(c) means for transmitting first metering signals commensurate with the values of said parameters from said modules;
(d) a ground station having means for receiving and processing said signals from said modules;
(e) said ground station further including means for receiving substation analog signals, and conditioning signals from existing current and potential transformers, processing the values of current and voltage on a second plurality of conductors and generating second metering signals in response thereto;
(f) means for multiplexing said second metering signals for processing at said ground station; and
(g) means at said ground station for integrating in a single processor the processing of said first and second metering signals.

26. The invention according to claim 25 wherein said ground station further includes means for monitoring alarm status, sequence-of-events, and performing select-before-operate control functions through interposing relays, pulse control and means for processing non-metering analog and pulse/digital signals.

27. The invention according to claim 25 wherein said ground station further includes means for establishing from said first metering signals whether each of the conductors of said first plurality is energized, and means for selecting an appropriate scale factor to be applied to the voltage reading of each of said sensor modules in accordance with the state of energization of adjacent conductors.

28. A system for monitoring a plurality of parameters associated with each of a plurality of energized electrical power conductors of a power delivery network over the full operating range from minimum to maximum conductor current, said system comprising:
(a) a plurality of sensor modules for complete installation and removal while said conductors are energized, one of said modules being mounted upon each of said energized conductors;
(b) means carried by each of said modules for sensing values of a plurality of parameters of the associated power conductor;
(c) means carried by each of said modules for identifying, processing and storing said sensed values;
(d) means carried by each of said modules for periodically transmitting a sequence of encoded signals in data bursts of predetermined duration from each of said plurality of sensor modules commensurate with each of said sensed values;
(e) means carried by each of said modules for controlling the starting times of said data bursts by said transmitting means of each of said modules to avoid simultaneous transmission, with consequent data collisions, by any two of said modules;
(f) means remote from said modules for receiving said signals from each of said plurality of modules and decoding said signals to provide said parameter values at said remote means, and to derive from said values operational status information, including normal, abnormal and transient operating conditions, about said power conductors; and
(g) means for controlling said power delivery network over said full operating range during all of said normal, abnormal and transient operating conditions, in accordance with said operational status information.

29. A method of monitoring and controlling a power delivery network having a plurality of power conductors over the full operating range from minimum to maximum conductor current, said method comprising:
(a) mounting upon each of said conductors a sensor module;
(b) measuring a plurality of parameters of each of said conductors by the module mounted thereon;
(c) transmitting from each of said modules to a remote receiver a sequence of encoded signals in data bursts of predetermined duration indicating the values of said measured parameters and module identification;
(d) controlling the starting times of said data bursts to avoid simultaneous transmission by any two of said modules;
(e) deriving from said values operational status information, including normal, abnormal and transient operating conditions, about said power conductors; and
(f) controlling said power delivery network over said full operating range during all of said normal, abonormal and transient operation conditions, in accordance with said operational status information.

* * * * *